(12) United States Patent
Nishimura

(10) Patent No.: US 8,686,387 B2
(45) Date of Patent: Apr. 1, 2014

(54) SEMICONDUCTOR MEMORY DEVICE AND METHOD FOR MANUFACTURING THE SAME

(75) Inventor: Jun Nishimura, Kuwana (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 179 days.

(21) Appl. No.: 13/431,150

(22) Filed: Mar. 27, 2012

(65) Prior Publication Data

US 2012/0313064 A1   Dec. 13, 2012

(30) Foreign Application Priority Data

Jun. 10, 2011   (JP) .................................. 2011-130657

(51) Int. Cl.
*H01L 29/02* (2006.01)
*H01L 47/00* (2006.01)

(52) U.S. Cl.
USPC .......................................................... 257/2

(58) Field of Classification Search
USPC .................. 257/2, 3, 4, E45.001, 5, E45.002,
257/314–326, E27.078, E29.3–E29.309,
257/E29.17, E21.645–E21.694, 225–234,
257/390, E27.076, E27.098–E27.101,
257/E27.077, E21.661, E21.662,
257/E21.666–E21.678, 296–313, 533,
257/595–602, 923–924, E27.016–E27.017,
257/E27.019–E27.021, E27.023–E27.025,
257/E27.03–E27.035, E27.037–E27.038,
257/E27.041–E27.045, E27.047–E27.048,
257/E27.071, E27.09, E27.092–E27.093,
257/E27.095, E27.114–E27.116,
257/E21.008–E21.021, E21.364; 438/382,
438/618, 270, 275–278, 171, 190, 210,
438/238–253, 329, 379, 387, 444, 901
See application file for complete search history.

(56) References Cited

U.S. PATENT DOCUMENTS

| | | | |
|---|---|---|---|
| 2009/0283739 A1* | 11/2009 | Kiyotoshi | 257/4 |
| 2010/0176368 A1 | 7/2010 | Ko et al. | |
| 2011/0147691 A1 | 6/2011 | Yasutake | |
| 2011/0233500 A1* | 9/2011 | Nishimura et al. | 257/2 |
| 2011/0297911 A1* | 12/2011 | Shima et al. | 257/4 |
| 2013/0221309 A1* | 8/2013 | Lee | 257/2 |
| 2013/0223124 A1* | 8/2013 | Park et al. | 365/96 |

* cited by examiner

*Primary Examiner* — Dao H Nguyen
*Assistant Examiner* — Tram H Nguyen
(74) *Attorney, Agent, or Firm* — Oblon, Spivak, McClelland, Maier & Neustadt, L.L.P.

(57) ABSTRACT

A semiconductor memory device includes a cell array layer having a memory cell. The memory cell has a current control device, a variable resistance device and a metal layer for silicide. A method for manufacturing the semiconductor memory device includes: forming the metal layer for silicide on a semiconductor layer for forming the current control device and a variable resistance device layer; selectively removing the variable resistance device layer and the metal layer through first etching; forming a first protective layer to cover at least a side surface of the metal layer exposed by the first etching; selectively removing a part of the semiconductor layer, through second etching; and forming a second protective layer to cover the variable resistance device layer, the metal layer for silicide, and the semiconductor layer.

20 Claims, 41 Drawing Sheets

FIG. 17A
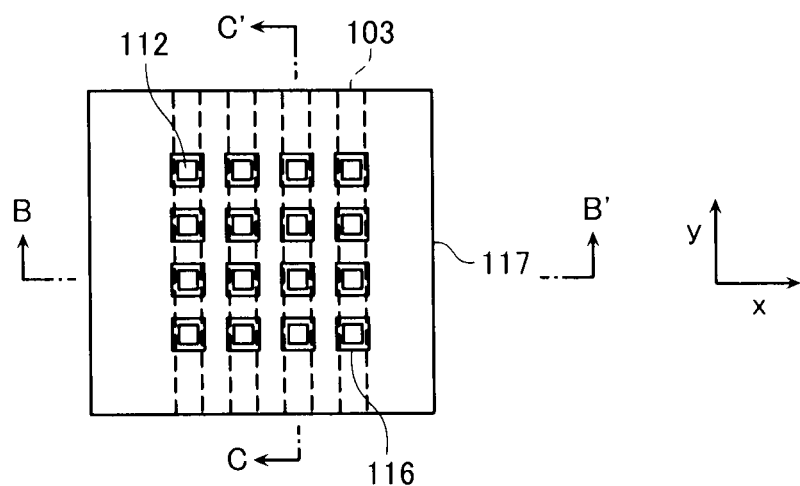
FIG. 17B
FIG. 17C
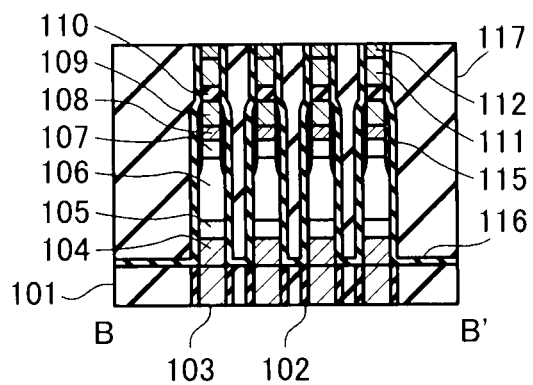
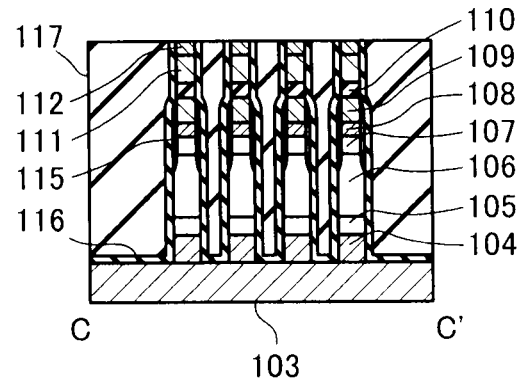

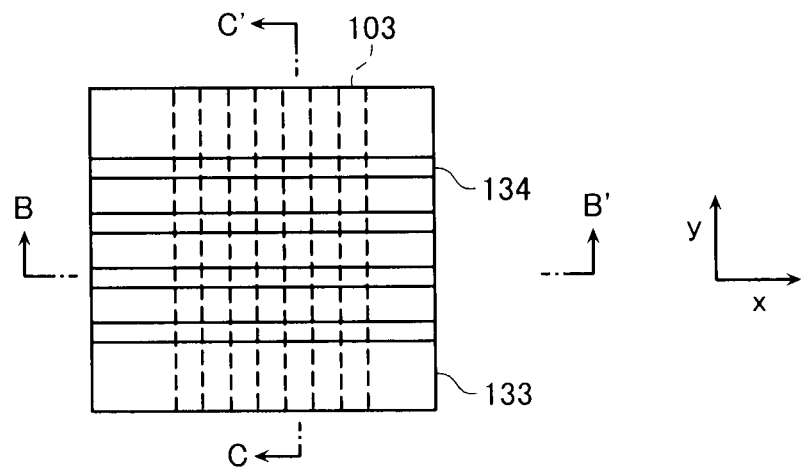
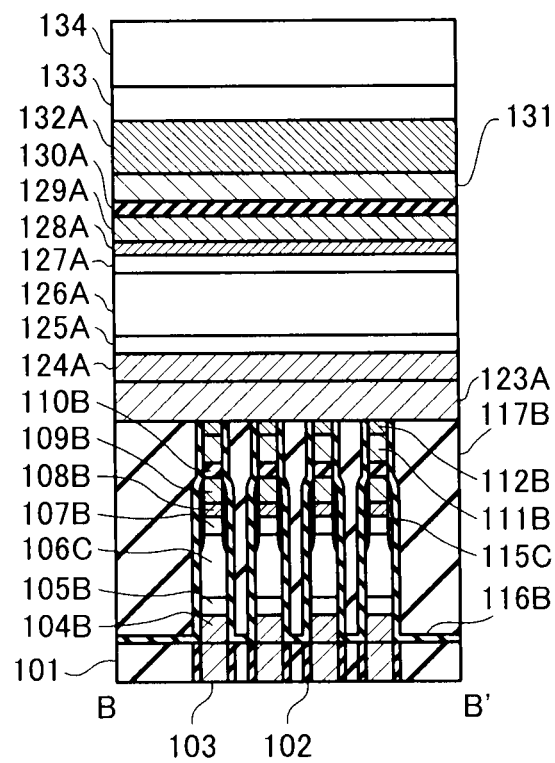
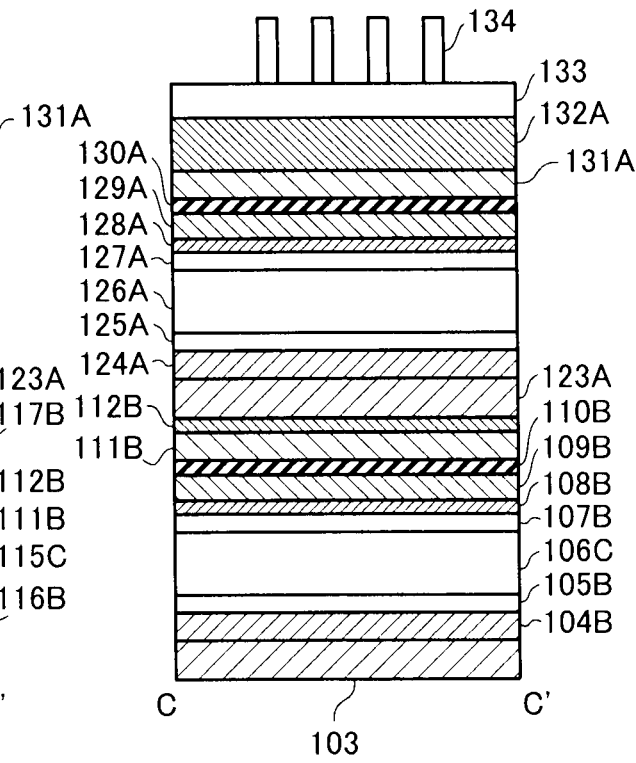

FIG. 39A
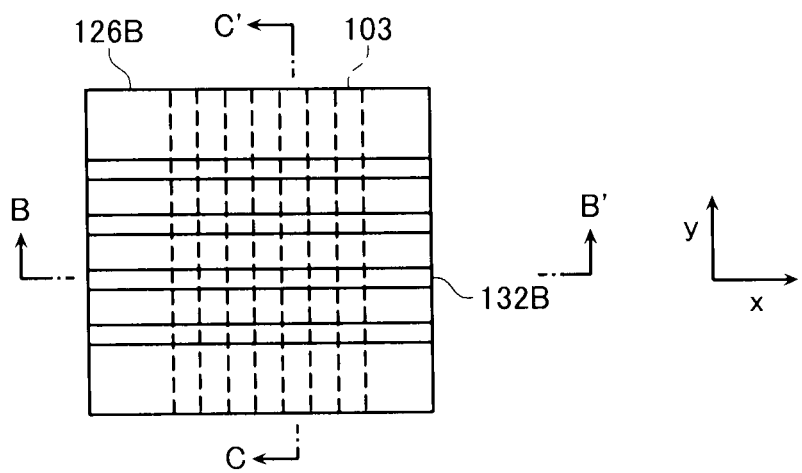
FIG. 39B
FIG. 39C
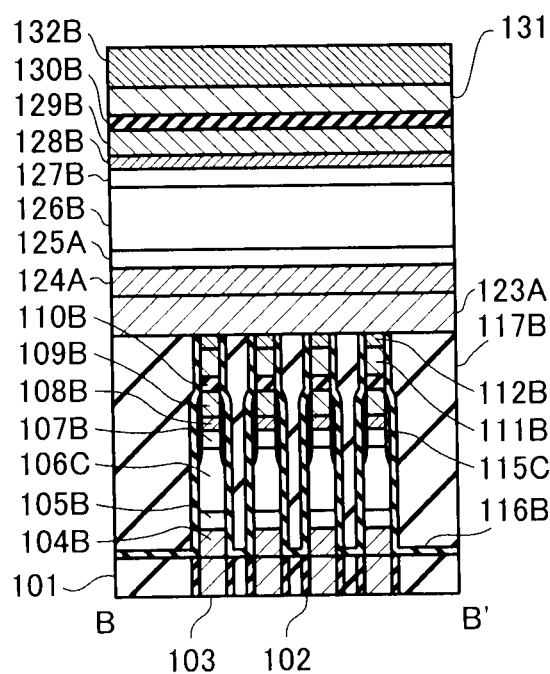
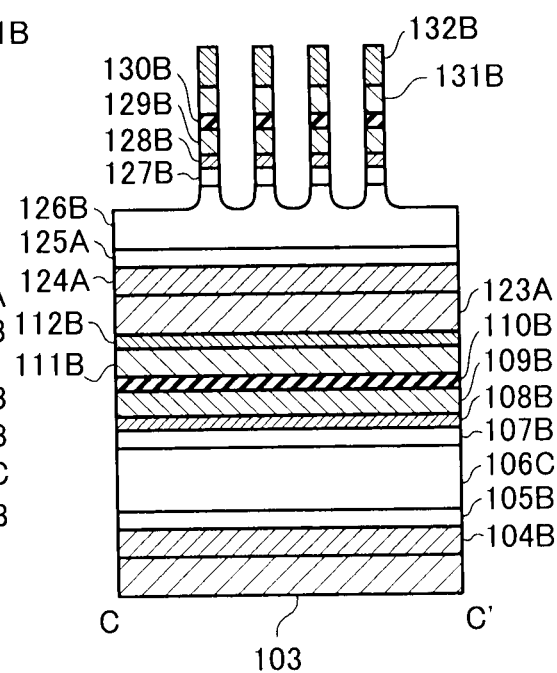

FIG. 43A
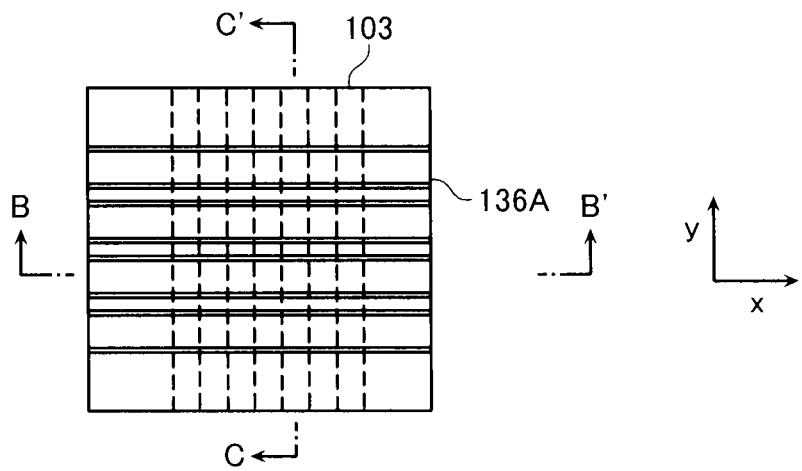
FIG. 43B
FIG. 43C
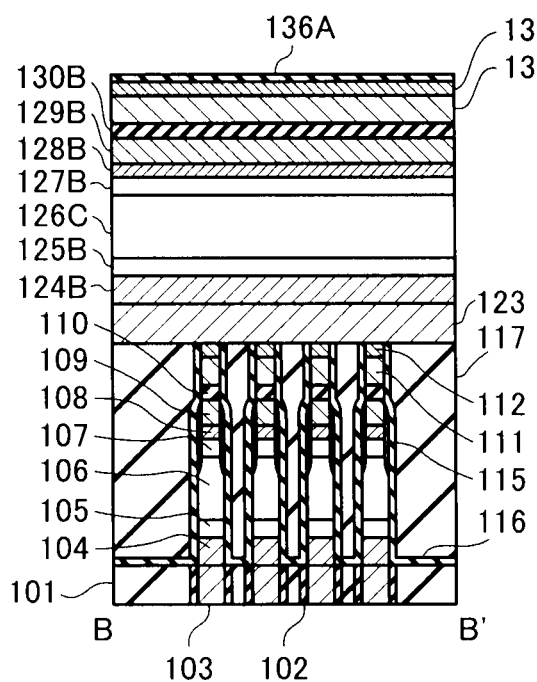
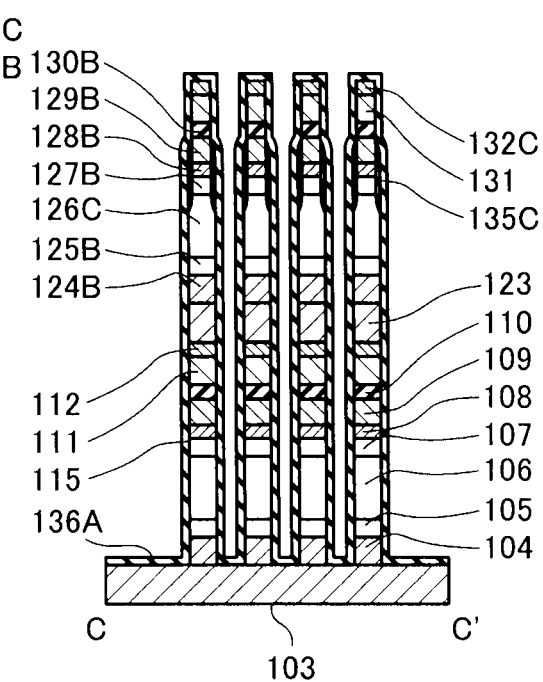

SEMICONDUCTOR MEMORY DEVICE AND METHOD FOR MANUFACTURING THE SAME

CROSS-REFERENCE TO RELATED APPLICATIONS

This application is based upon and claims the benefit of priority from the prior Japanese Patent Application No. 2011-130657, filed on Jun. 10, 2011, the entire contents of which are incorporated herein by reference.

FIELD

Embodiments described herein relate to a semiconductor memory device and a method for manufacturing the same.

BACKGROUND

Description of the Related Art

Conventionally, a well-known electrically rewritable non-volatile memory is a flash memory wherein a cell array including memory cells with a floating gate structure are NAND-connected or NOR connected. In addition, a ferroelectric memory is known also as a nonvolatile and high-speed random access memory.

As a proposed technique for decreasing the size of the memory cells, a resistance switching memory uses variable resistance devices for memory cells. Examples of the variable resistance devices are phase change memory devices, MRAM devices, memory devices of a polymer ferroelectric RAM (PFRAM), and ReRAM devices. The phase change memory devices change the resistance value in accordance with a change in the state of crystallization/amorphization of a chalcogenide compound. The MRAM devices use the resistance change by a tunneling magnetoresistance effect. The memory devices of the PFRAM include conductive polymers as resistance devices. The ReRAM devices cause a resistance change by application of electrical pulse.

In such a resistance switching memory, a sneak current for a non-selected memory cell should be controlled, when data is written and read to and from a selected memory cell. Thus, the variable resistance devices are connected to current control devices (for example, diode) in series. Each of the variable resistance devices and current control devices is included in a so-called cross-point semiconductor memory device, and is formed in a pillar-like shape between first wiring and second wiring through an etching process in the semiconductor memory device.

A problem is occurrence of an open failure in which a forward current of the current control devices is reduced, if the above-described resistance variable semiconductor memory device is made small in size.

BRIEF DESCRIPTION OF THE DRAWINGS

FIGS. 17A to 17C are a plane view, a front view, and a side view, for explaining the method for manufacturing the same semiconductor memory device.

FIGS. 38A to 38C are a plane view, a front view, and a side view, for explaining a method for manufacturing the same semiconductor memory device.

FIGS. 39A to 39C are a plane view, a front view, and a side view, for explaining a method for manufacturing the same semiconductor memory device.

FIGS. 43A to 43C are a plane view, a front view, and a side view, for explaining a method for manufacturing the same semiconductor memory device.

DETAILED DESCRIPTION

According to the embodiments, there is provided a method for manufacturing a semiconductor memory device including a cell array layer having a first wiring, a memory cell laminated on the first wiring, and a second wiring formed to intersect the first wiring on the memory cell, the memory cell having a current control device, a variable resistance device and a metal layer for silicide arranged therebetween. The method comprises the steps of: forming a first wiring layer for forming the first wiring; sequentially forming a semiconductor layer for forming the current control device on the first wiring layer, the metal layer for silicide, and a variable resistance device layer for forming the variable resistance device; selectively removing the variable resistance device layer and the metal layer for silicide through first etching until it reaches the semiconductor layer, leaving a part for forming the memory cell; forming a first protective layer to cover at least a side surface of the metal layer for silicide exposed by the first etching; selectively removing the semiconductor layer which has not been removed by the first etching through second etching, leaving a part for forming the memory cell; and forming a second protective layer to cover the variable resistance device layer, the metal layer for silicide, and the semiconductor layer.

Embodiments will now be explained with reference to the drawings attached.

First Embodiment

[Overall Configuration]

Figure 1:
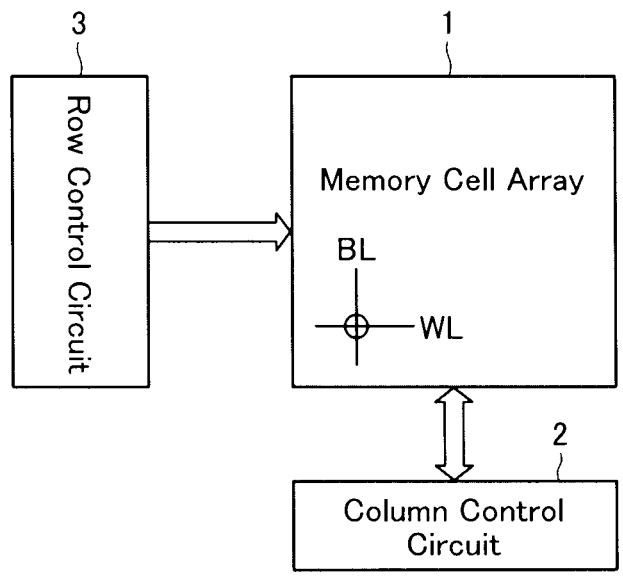
FIG. 1 is a block diagram showing a configuration of a semiconductor memory device according to a first embodiment.

FIG. 1 is a block diagram showing a configuration of a semiconductor memory device according to the first embodiment. This semiconductor memory device includes a memory cell array 1 in which memory cells MC are arranged in matrix. Each of the memory cells MC includes a variable resistance device and a current control device, as will be described later.

Bit lines BL of the memory cell array 1 are electrically connected to a column control circuit 2. This column control circuit 2 controls the bit lines BL of the memory cell array 1, and enables to delete data of the memory cells MC, to write data into the memory cells MC, and to read data from the memory cells MC. Word lines WL of the memory cell array 1 are electrically connected to a row control circuit 3. This row control circuit 3 selects a word line WL of the memory cell array 1, and enables to delete data of the memory cells MC, to write data to the memory cells MC, and to read data from the memory cells MC.

[Memory Cell Array]

Figure 2:
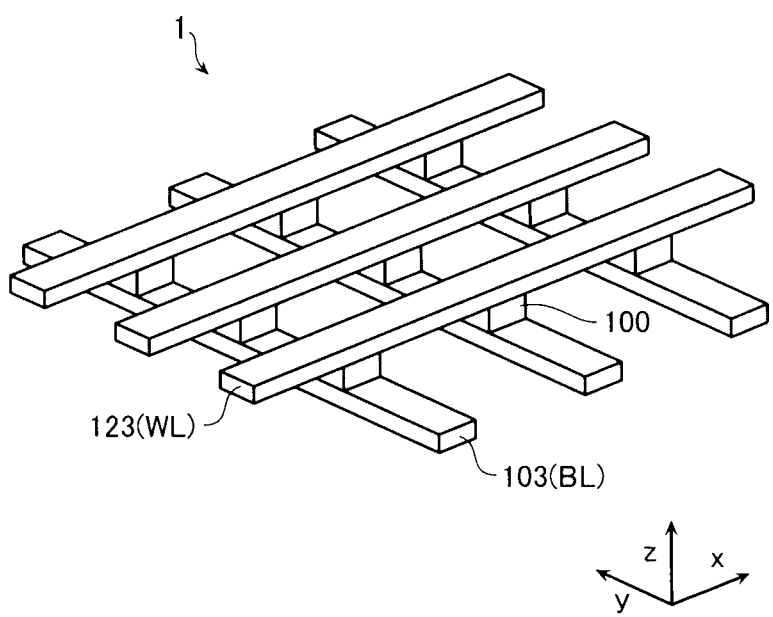
FIG. 2 is a perspective diagram of a part of a memory cell array of the semiconductor memory device according to the same embodiment.
Figure 3A:
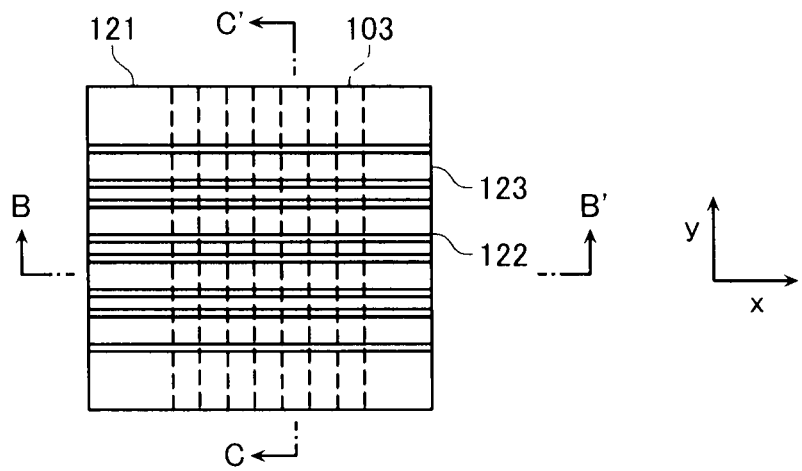
FIGS. 3A to 3C are a plane view and cross sectional views of a part of the memory cell array of the semiconductor memory device according to the same embodiment.
Figure 3B:
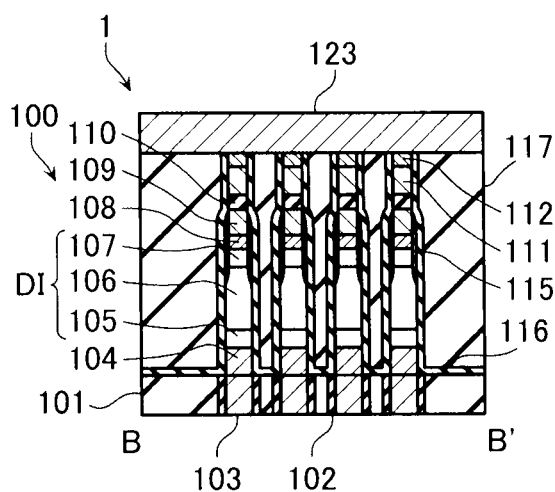
Figure 3C:
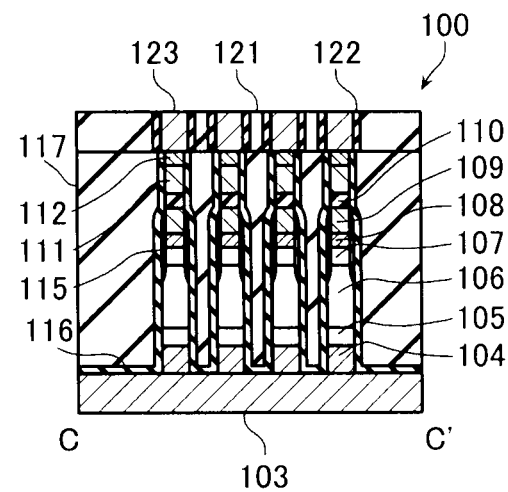

FIG. 2 is a perspective diagram of a part of the memory cell array 1. FIG. 3A is a plane view of a part of the memory cell array 1, FIG. 3B is a cross sectional view taken along a line B-B' of FIG. 3A, and FIG. 3C is a cross sectional view taken along a line C-C' of FIG. 3A. The memory cell array 1 is a cross-point memory cell array which is formed on a non-illustrative semiconductor substrate, and includes a plurality of bit lines 103 (BL) which are arranged in parallel to each other and a plurality of word lines 123 (WL) which are arranged in parallel to each other and to intersect the bit lines 103.

The bit lines 103 and the word lines 123 are preferably formed of materials having high temperature resistance and low resistance value. Examples of such materials are: tungsten (W); titanium (Ti); tungsten nitride (WN); titanium nitride (TiN); tungsten silicide (WSi); nickel silicide (NiSi); and cobalt silicide (CoSi). These bit lines 103 and the word lines 123 are embedded in interlayer insulating layers 101 and 121 through barrier layers 102 and 122 such as silicon nitride (SiN), respectively.

[Memory Cell MC]

In each intersection of the bit lines 103 and the word lines 123, the memory cells 100 is arranged to be sandwiched between both lines. The memory cells 100 are formed in a pillar-like shape such that the current control device DI and the variable resistance device 110 are connected in series.

In this example, the current control device DI is a PIN-type diode including a p-type semiconductor 107, an i-type semiconductor 106, and an n-type semiconductor 105. Materials and structure of the current control device DI used for the memory cells 100 are not particularly limited, as long as it has predetermined current control characteristics in the voltage-current characteristics. For example, other than silicon (Si), the material for use in the current control device DI may be a semiconductor (for example, germanium (Ge)), mixed crystals of a semiconductor and metal, an insulator, such as an oxide. Various diodes, such as PN, MIS, SIS, may be applied as well.

The resistance of the variable resistance device 110 can be changed by current, heat, and chemical energy, under voltage application. The variable resistance device 110 may include titanium dioxide ($TiO_2$), nickel oxide (NiO), a metal oxidation film (MeOx), hafnium oxide (HfO), and carbon. The variable resistance device 110 may be a bipolar-type device or a unipolar device. The bipolar-type device switches between a high resistance state and a low resistance state by switching the polarity of the voltage application, while the unipolar device switches between a high resistance state and a low resistance state without switching the polarity of the voltage application.

Electrodes 104, 109, and 111 (for example, titanium nitride (TiN)) are arranged between the current control device DI and the bit line 103, and on the top and bottom of the variable resistance device 110. These electrodes 104, 109 and 111 function, for example, as a barrier metal layer and an adhesive layer. A top electrode 112 (for example, tungsten (W)) is arranged on the top of the electrode 111.

A metal layer 108 for silicide is arranged between the current control device DI and the electrode 109 below the variable resistance device 110. This metal layer 108 for silicide is to realize silicidation of the interface with the metal layer 108 of the p-type semiconductor 107, to lower the interface resistance. It is comprehended that the metal layer 108 for silicide has a function as a nucleus of the crystallization (polysiliconization) of the semiconductors 105 to 107.

Figure 4:
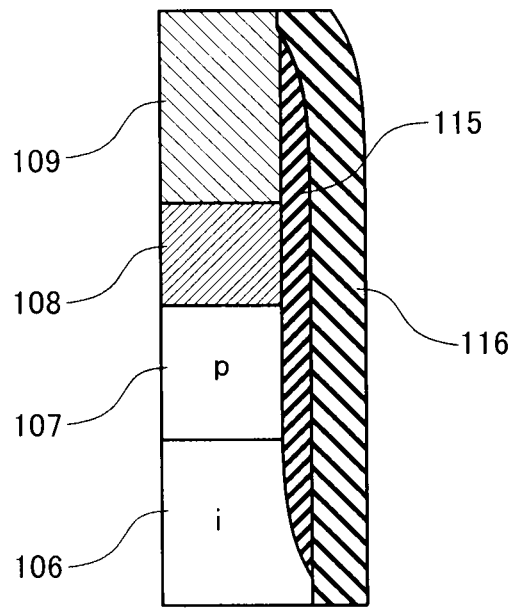
FIG. 4 is an enlarged sectional view of a partial configuration of the semiconductor memory device according to the same embodiment.

In the memory cells 100 of this embodiment, as illustrated in the enlarged view of FIG. 4, at least the side surface of the upper end of the i-type semiconductor 106, the p-type semiconductor 107, the metal layer 108 for silicide, and the lower end of the electrode 109 are covered with a first protective layer 115. As shown in FIGS. 3A and 3B, the sidewall in a range from an electrode 104 to the top electrode 112 is further covered with a second protective layer 116 in addition the first protective layer 115.

The first protective layer 115 functions for protecting the metal layer 108 for silicide with low etching durability, in the manufacturing process of the memory cell array 1. The first protective layer 115 may include silicon nitride (SiN), a double-sided wall ($SiO_2$/SiN) of silicon dioxide and silicon nitride, or tetraethoxysilane (TEOS), whose selection ratio is 10 or greater with respect to the semiconductor layer. The second protective layer 116 is provided to restrain oxidation of the top electrode 112 (tungsten (W)) in a thermal oxidation process of an interlayer insulating layer 117. The second protective layer 116 may include silicon nitride (SiN).

[Method for Manufacturing Semiconductor Memory Device]

Figure 5A:
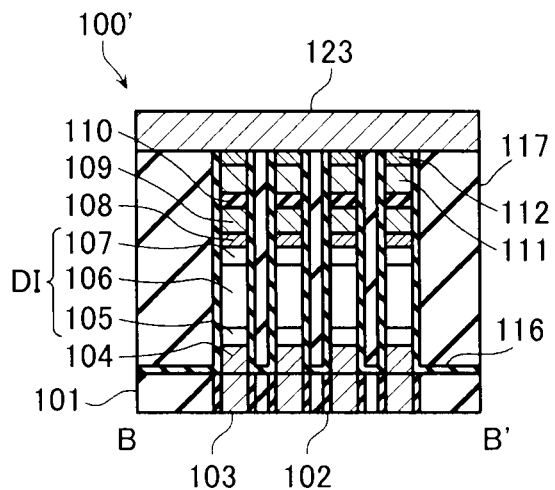
FIGS. 5A and 5B are cross sectional views of a partial memory cell array of the semiconductor memory device according to a comparative example.
Figure 5B:
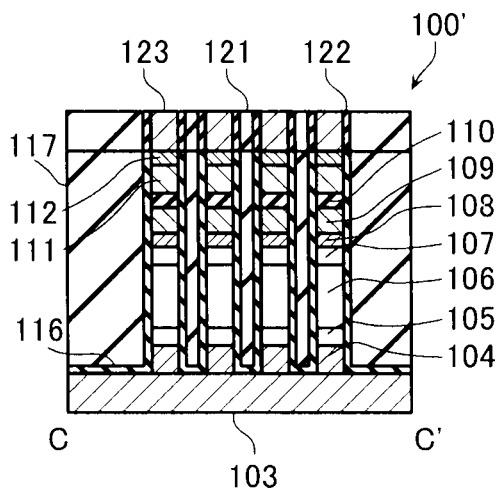

Descriptions will now be made to a method for manufacturing a non-volatile semiconductor memory device according to this embodiment. First, descriptions will be made to a problem of a comparative example, before explaining this embodiment. FIGS. 5A and 5B show configurations of memory cells of the comparative example, while FIGS. 6A and 6B and FIGS. 7A and 7B show partial processes of a method for manufacturing a memory cells according to the comparative example.

Figure 6A:
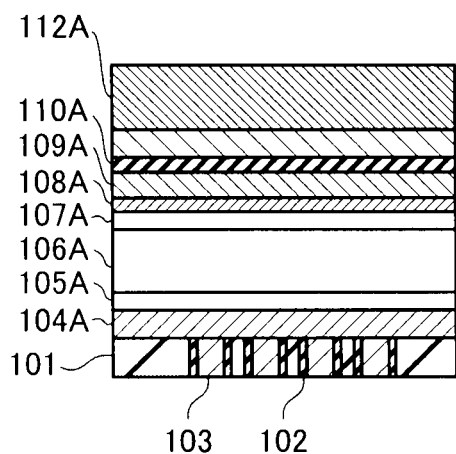
FIGS. 6A and 6B are a front view and a side view, for explaining a method for manufacturing the memory cell array of the semiconductor memory device according to the comparative example.
Figure 6B:
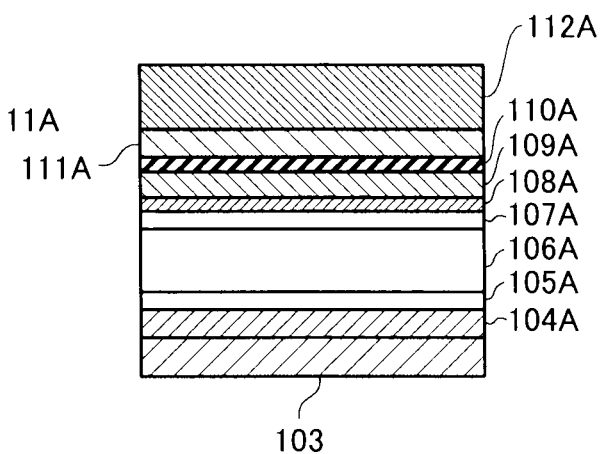
Figure 7A:
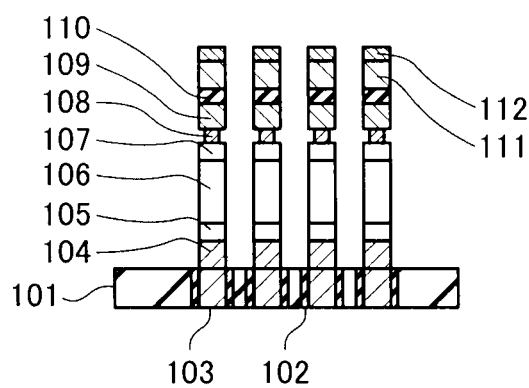
FIGS. 7A and 7B are a front view and a side view, for explaining the method for manufacturing the memory cell array of the semiconductor memory device according to the comparative example.
Figure 7B:
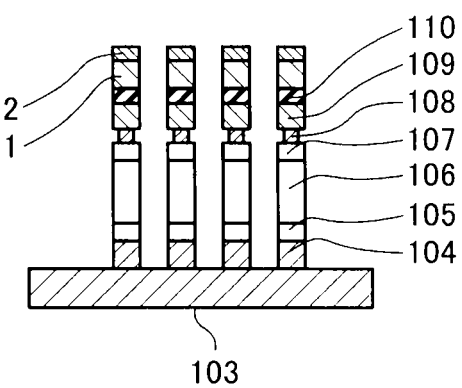

As shown in FIGS. 5A and 5B, memory cells 100' of the comparative example does not include the first protective layer 115 shown in FIG. 3. The manufacturing process of this memory cells 100', as shown in FIGS. 6A and 6B, includes a process of selectively etching a laminated structure of different material layers 104A to 112A forming the memory cells 100', on the bit lines 103 embedded in the interlayer insulating layer 101, to form a plurality of pillars shown in FIGS. 7A and 7B. At this time, the etching progresses toward in a non-illustrative lower substrate direction. Thus, the further from the substrate, the longer time the layer is exposed to the etching gas, resulting the progress of the side etching or oxidation. Particularly, a problem is that Ti generally used for the metal layer 108 for silicide is easily eroded by gas (Cl, Br, F) that is used when TiN or the semiconductor layer is reactive ion etched (RIE), resulting in the progress of the side etching or oxidation of the metal layer 108 for silicide.

As described above, such a metal layer 108 for silicide has a function siliciding the interface with the semiconductor layer to lower the interface resistance, and has a function as a nucleus of crystallization when the semiconductor layer is crystallized to form polysilicon. Thus, if the metal layer 108 for silicide is reduced, the interface resistance cannot be reduced. In addition, the semiconductor layer becomes amorphous, and an enough current cannot be provided as the current control device DI, thus resulting in an abnormal operation.

According to the method for manufacturing the semiconductor memory device according to this embodiment, the above problem is solved by providing the first protective layer 115 to cover the side surface of the top of the semiconductor, of the metal layer 108 for silicide and of the electrode 109.

Descriptions will now be made to a method for manufacturing the semiconductor memory device according to this embodiment with reference to FIGS. 8A to 8C to FIGS. 18A to 18C.

Figure 8A:
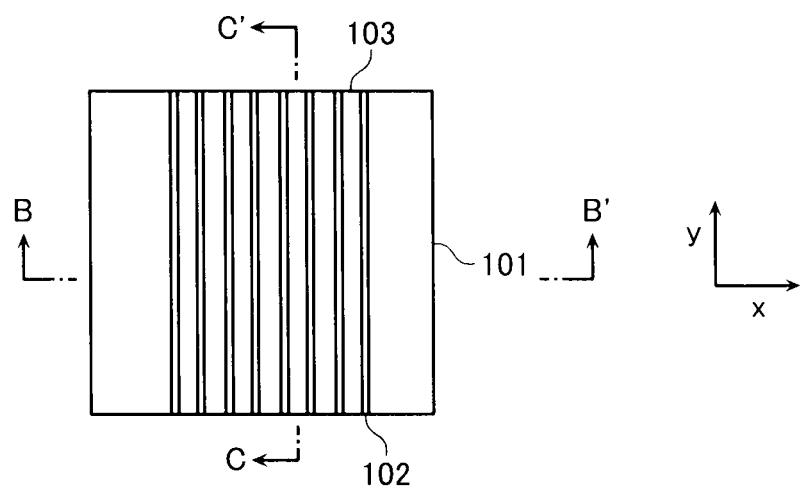
FIGS. 8A to 8C are a plane view, a front view, and a side view, for explaining a method for manufacturing the semiconductor memory device according to the first embodiment.
Figure 8B:
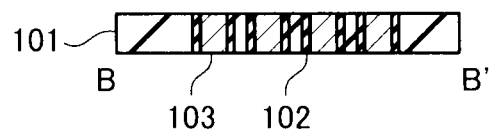
Figure 8C:
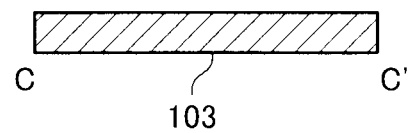

As shown in FIGS. 8A to 8C, the bit lines 103 are formed in the interlayer insulating layer 101 through the barrier layers 102, using an embedding technique or RIE technique. The patterning of the bit lines 103 can finely be achieved using, for example, a sidewall transferring technique or immersion ArF.

Figure 9A:
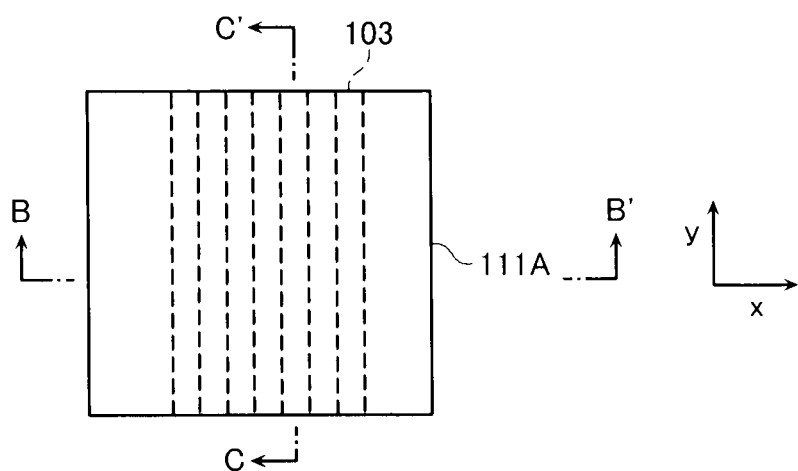
FIGS. 9A to 9C are a plane view, a front view, and a side view, for explaining the method for manufacturing the same semiconductor memory device.
Figure 9B:
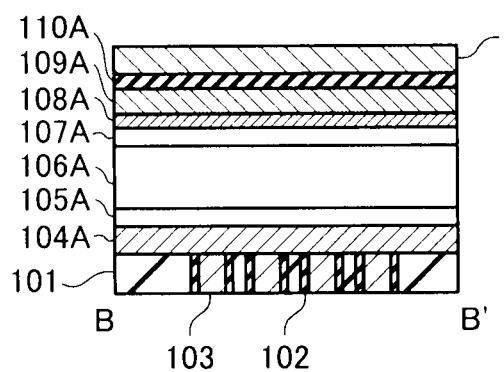
Figure 9C:
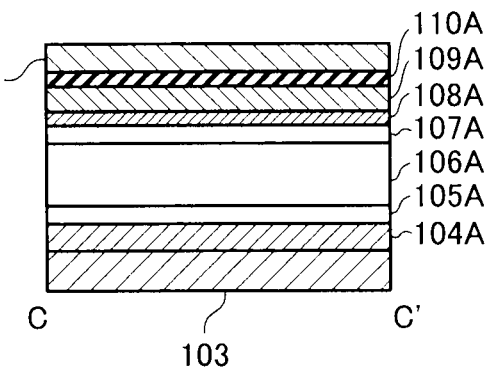

As illustrated in FIGS. 9A to 9C, on the interlayer insulating layer 101 including the bit lines 103 embedded therein, a conductive layer 104A as the electrode 104, an n-type semiconductor layer 105A, an i-type semiconductor layer 106A, a p-type semiconductor layer 107A, a metal layer 108A as the metal layer 108 for silicide, a conductive layer 109A as the electrode 109, a variable resistance layer 110A as the variable resistance device 110, and a conductive layer 111A as the electrode 111 are accumulated. A conductor, like TiN, may be applied as the conductive layers 104A, 109A, and 111A, as the electrodes. Some materials, such as $TiO_2$, NiO, MeOx, HfO, and Carbon, may be applied as the variable resistance layer 110A.

Figure 10A:
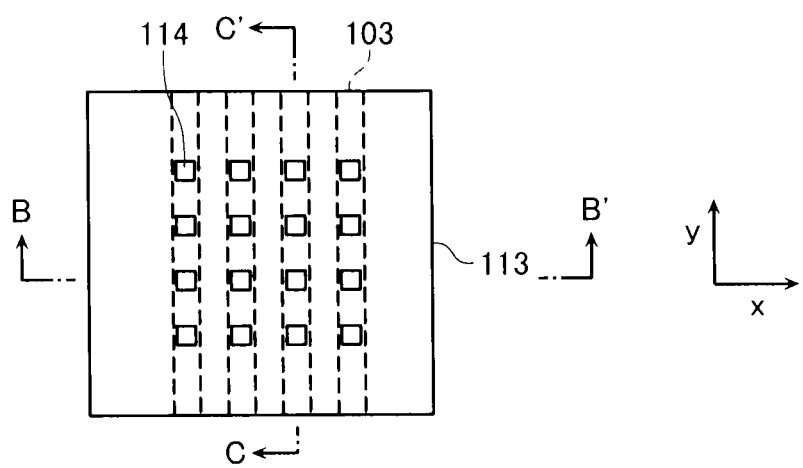
FIGS. 10A to 10C are a plane view, a front view, and a side view, for explaining the method for manufacturing the same semiconductor memory device.
Figure 10B:
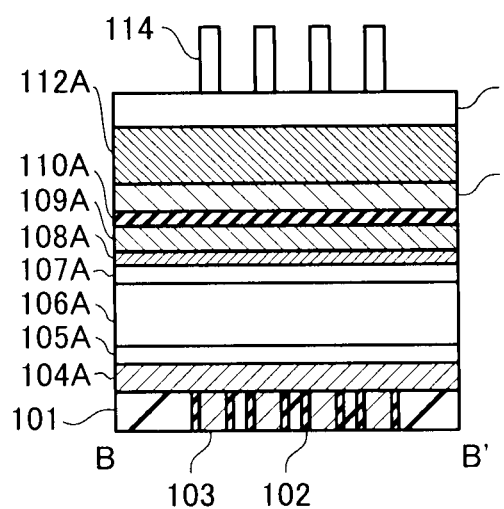
Figure 10C:
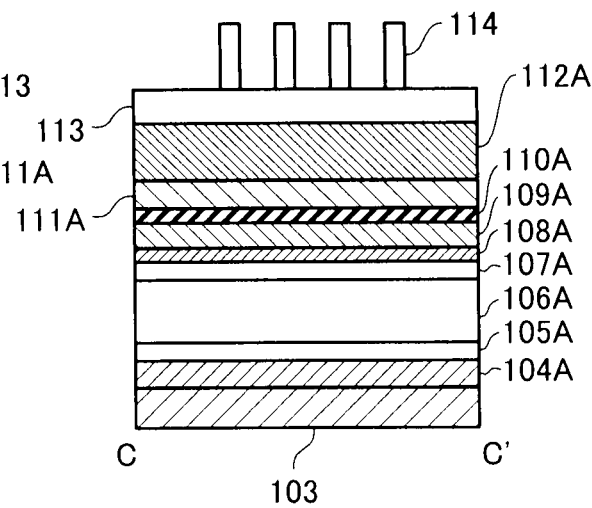

As shown in FIGS. 10A to 100, a conductive layer 112A as the top electrode 112 and the hard mask 113 are accumulated on the conductive layer 111A, and a resist pattern 114 is formed thereon. The resist pattern 114 is formed such that the memory cells 100 is arranged in the intersection in the xy plane of the bit lines 103 and the word lines 123 to be formed afterwards. That is, the resist pattern 114 is an isolated pattern, for forming the memory cells 100 with pillars at the first etching. A conductor (for example, W) may be applied as the conductive layer 112A, and $SiO_2$, SiN, or C may be applied as the hard mask 113. The resist pattern 114 may be patterned using a sidewall transferring method or an immersion ArF patterning method.

Figure 11A:
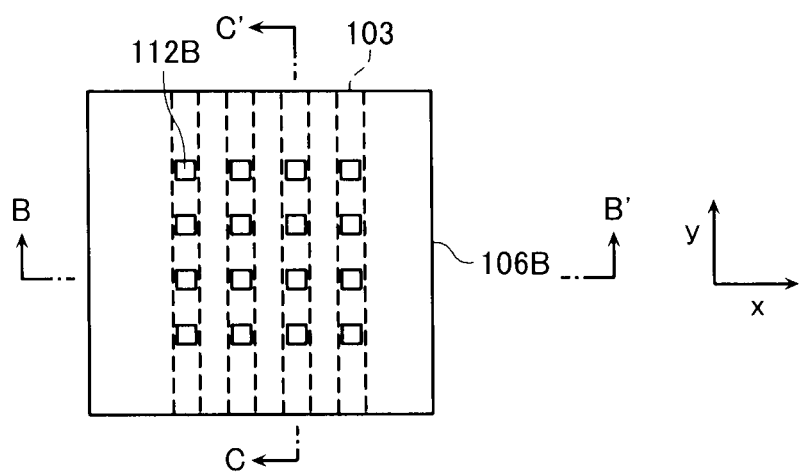
FIGS. 11A to 11C are a plane view, a front view, and a side view, for explaining the method for manufacturing the same semiconductor memory device.
Figure 11B:
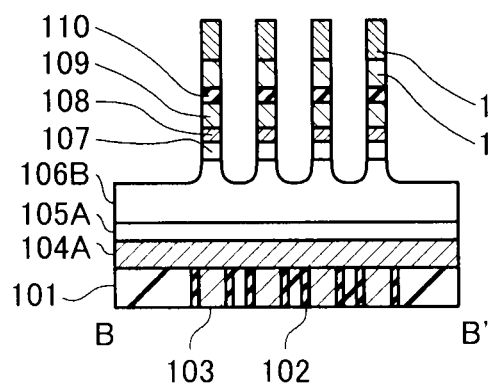
Figure 11C:
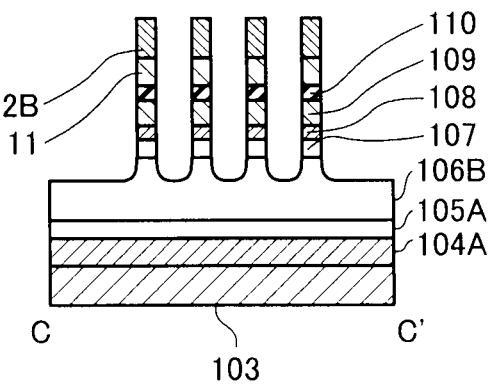

As shown in FIGS. 11A to 11C, the hard mask 113 and the conductive layer 112A are processed through the etching, using the resist pattern 114 as a mask. After that, the etching is performed in a range from the conductive layer 111A to the upper surface of the i-type semiconductor layer 106A, using the processed hard mask 113 and the conductive layer 112A as a mask. This results in forming, on an i-type semiconductor layer 106B, a plurality of pillar-like structures, in which the p-type semiconductor 107, the metal layer 108 for silicide, the electrode 109, the variable resistance device 110, the electrode 111, and a conductive layer 112B, are laminated.

Figure 12A:
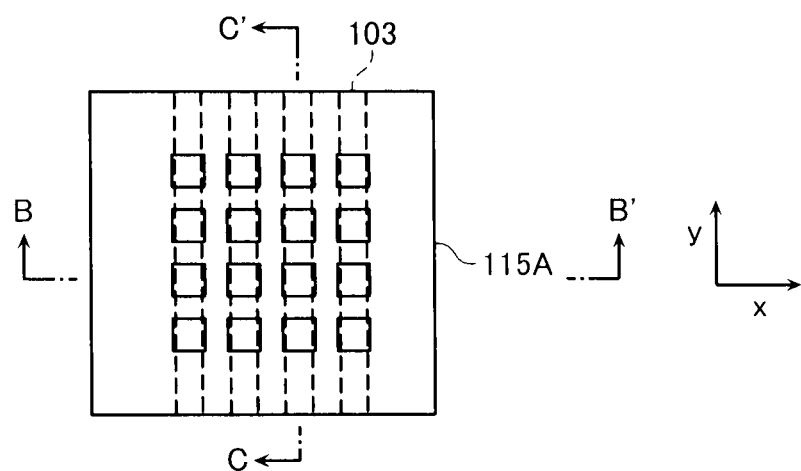
FIGS. 12A to 12C are a plane view, a front view, and a side view, for explaining the method for manufacturing the same semiconductor memory device.
Figure 12B:
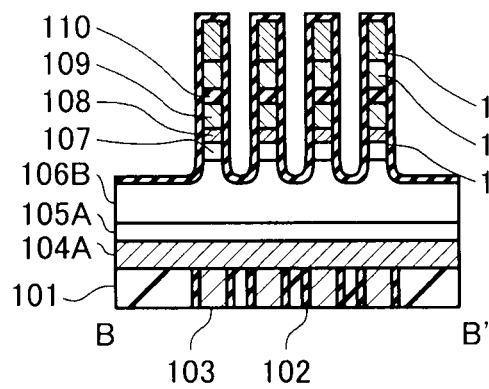
Figure 12C:
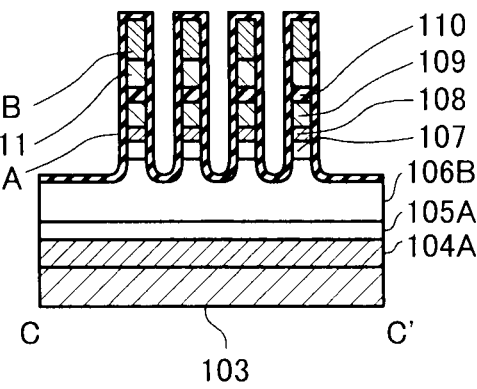

As shown in FIGS. 12A to 12C, an insulating layer 115A as the first protective layer 115 is formed to cover the upper surface of the i-type semiconductor layer 106B, sidewalls from the n-type semiconductor 107 to the conductive pillar 112B, and the upper surface of the conductive pillar 112B. Some material, such as SiN or TEOS, with a selection ratio of 10 or greater with respect to the semiconductor layers 105A to 107A, may be applied as the insulating layer 115A. The insulating layer 115A may also be formed as a multi-layer, such as a double layer of $SiO_2$/SiN. ALD-SiN, HCD-SiN, DCS-SiN, and PeALD-$SiO_2$ are available as SiN, and ULT-$SiO_2$, ALD-$SiO_2$, PeALD-$SiO_2$, and LTO are available as $SiO_2$.

Figure 13A:
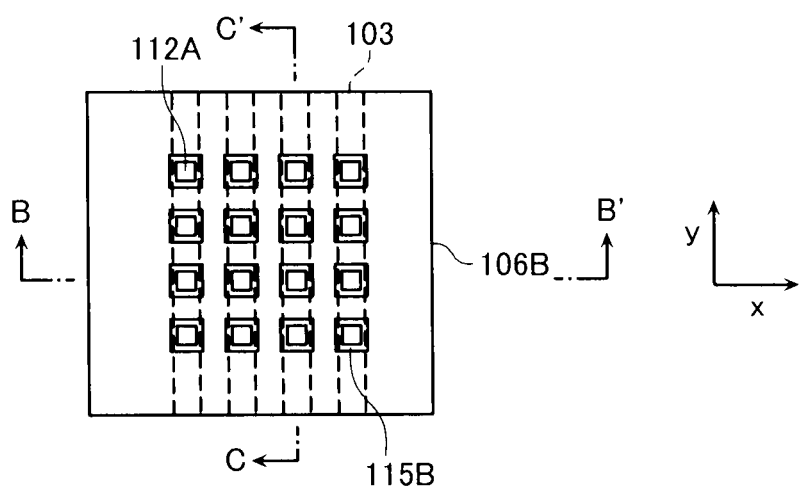
FIGS. 13A to 13C are a plane view, a front view, and a side view, for explaining the method for manufacturing the same semiconductor memory device.
Figure 13B:
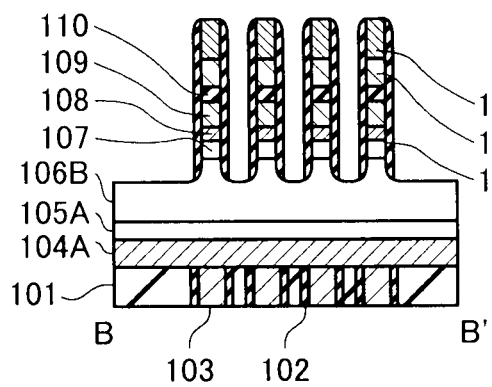
Figure 13C:
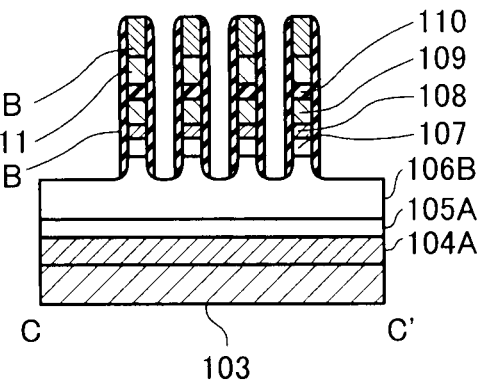

As shown in FIGS. 13A to 13C, of the insulating layer 115A, some parts are removed. The removed parts include a part formed on the upper surface of the i-type semiconductor layer 106B and a part formed on the upper surface of the conductive pillar 112B. As a result, the insulating layer 115B is formed on the sidewall part of the pillar.

Figure 14A:
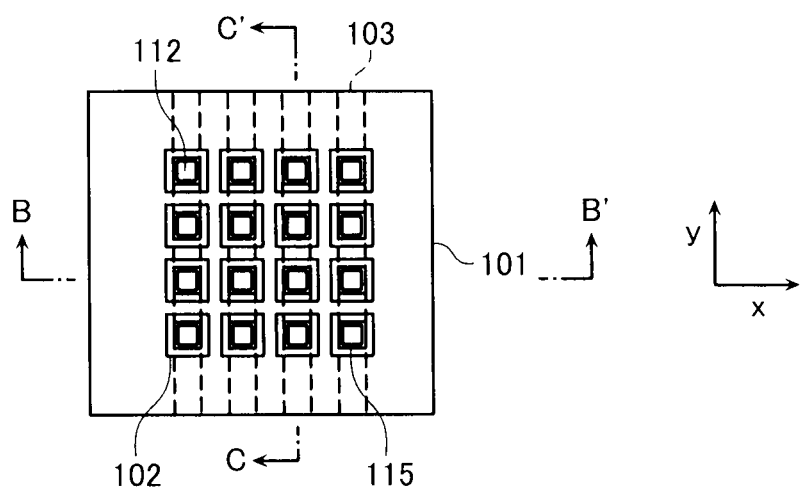
FIGS. 14A to 14C are a plane view, a front view, and a side view, for explaining the method for manufacturing the same semiconductor memory device.
Figure 14B:
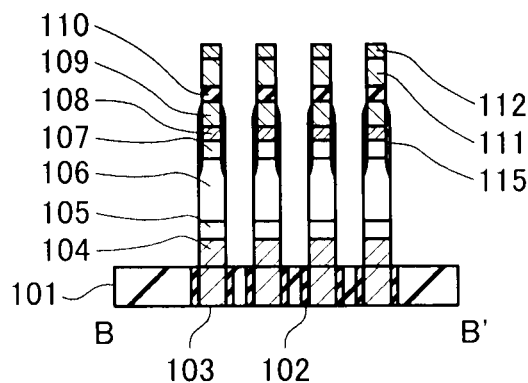
Figure 14C:
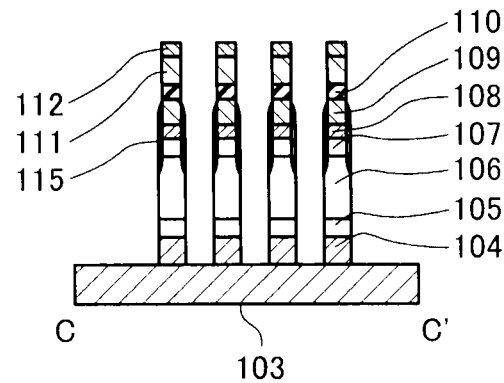

As shown in FIGS. 14A to 14C, the etching is performed to process the conductive layer 112B, the insulating layer 115B, the i-type semiconductor layer 106B, the n-type semiconductor layer 105A, and the conductive layer 104A. This results in forming a plurality of pillar-like laminated structures formed by the electrode 104, the n-type semiconductor 105, the i-type semiconductor 106, the p-type semiconductor 107, the metal layer 108 for silicide, the electrode 109, the variable resistance device 110, the electrode 111, the top electrode 112 and the first protective layer 115 covering a range from the side wall of the upper part of the i-type semiconductor 106 to a part of the electrode 109.

Figure 15A:
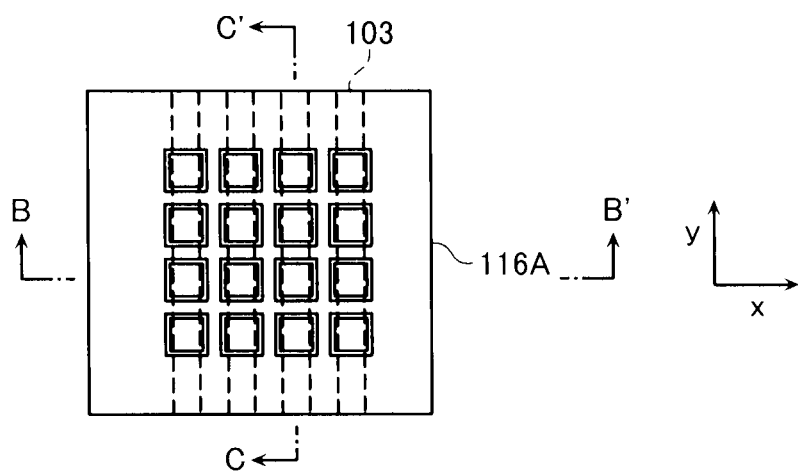
FIGS. 15A to 15C are a plane view, a front view, and a side view, for explaining the method for manufacturing the same semiconductor memory device.
Figure 15B:
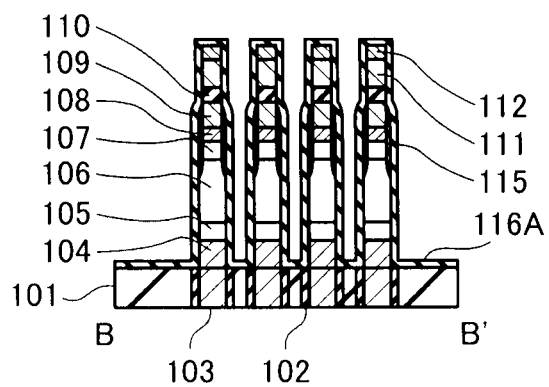
Figure 15C:
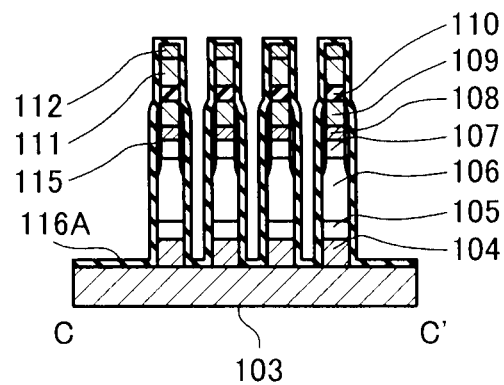

As shown in FIGS. 15A to 15C, an insulating layer 116A as the second protective layer 116 is formed to cover the upper surface of the substrate 101, the sidewall from the electrode 104 to the top electrode 112, and the upper surface of the top electrode 112. Some kind of materials, such as SiN, may be applied as the insulating layer 116A. This kind of materials restrains thermal oxidation of the top electrode 112 at the time the interlayer insulating layer 117 is formed.

Figure 16A:
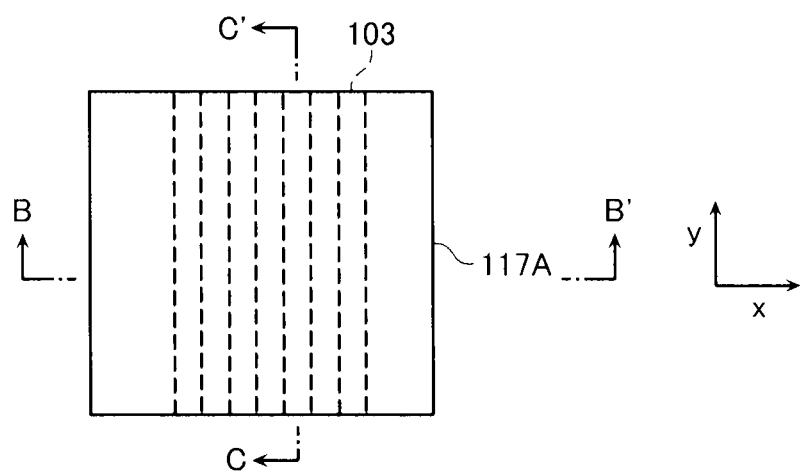
FIGS. 16A to 16C are a plane view, a front view, and a side view, for explaining the method for manufacturing the same semiconductor memory device.
Figure 16B:
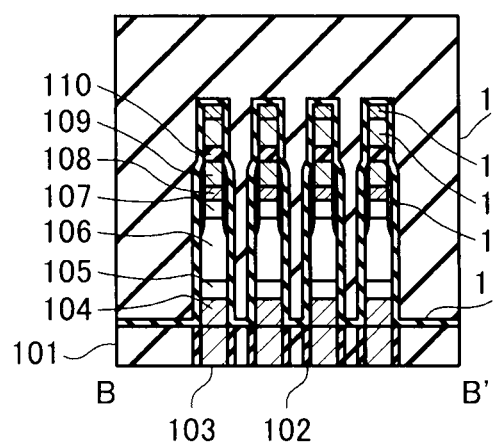
Figure 16C:
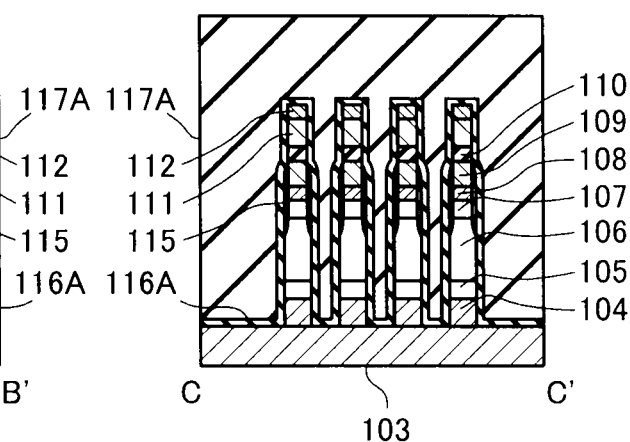
Figure 18A:
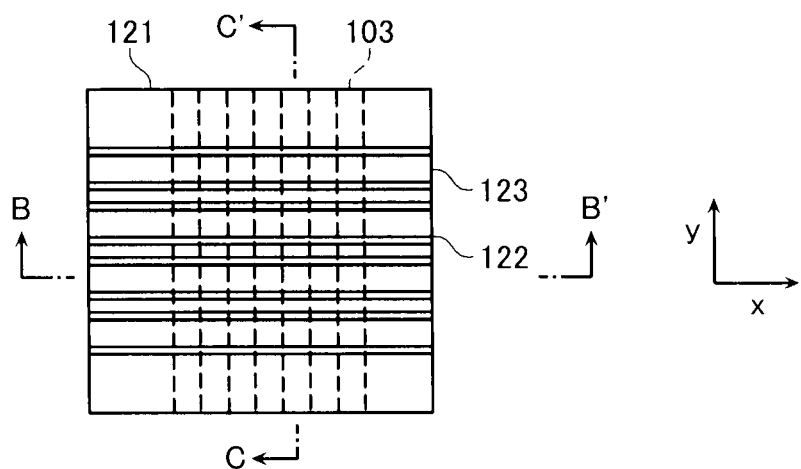
FIGS. 18A to 18C are a plane view, a front view, and a side view, for explaining the method for manufacturing the same semiconductor memory device.
Figure 18B:
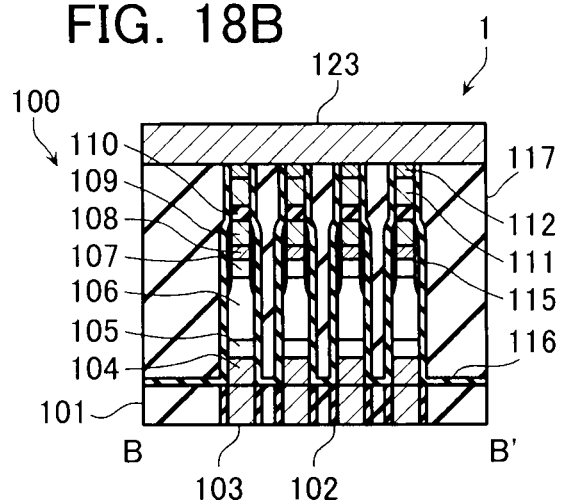
Figure 18C:
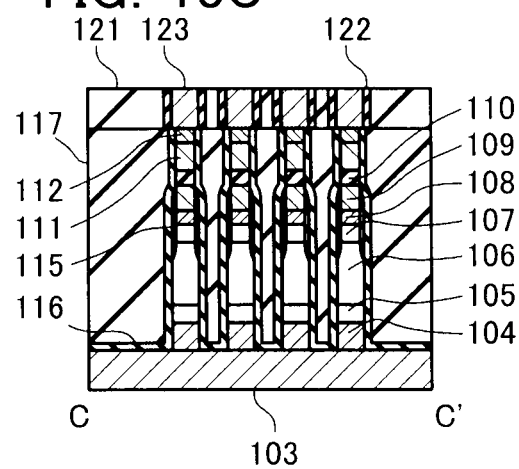

As shown in FIGS. 16A to 16C, an insulating layer 117A as the interlayer insulating layer 117 is accumulated and steam oxidation is performed. Note, however, that if the insulating layer 117A is not a film with application properties, the steam oxidation is not necessary. After that, as shown in FIGS. 17A to 17C, CMP is performed for the insulating layer 117A until the top electrode 112 is exposed, thereby forming the interlayer insulating layer 117 and the second protective layer 116. As shown in FIGS. 18A to 18C, the interlayer insulating layer 121, the barrier layer 122, and the word line 123 are formed. The interlayer insulating layer 121 and the barrier layer 122 are formed, further to form the memory cell array 1 on the word line 123. Thus, when forming the uppermost memory cell array 1, there is no need to provide the interlayer insulating layer 121 and the barrier layer 122. When to form the memory cell array 1 further on the upper part of the word line 123, the process shown in FIGS. 9A to 9C to FIGS. 18A to 18C should be repeated. When to further form the memory cell array 1, the wiring of a memory cell array 1 to be newly formed on top of the other may be rotated by 90 degrees in the xy plane from the lower memory cell array 1. In addition, the order of the semiconductor layers 104 to 106 are reversed.

According to the method for manufacturing the semiconductor memory device according to this embodiment, the side etching of the metal layer 108 for silicide can be avoided, by covering the sidewall of the upper end of the current control device DI, the metal layer 108 for silicide, and the lower end of the electrode 109, with the first protective layer 115. This enables to stably manufacture the semiconductor memory device.

In this embodiment, the etching is performed up to the i-type semiconductor layer 106A, before forming the insulating layer 115A as the first protective layer 115. However, the etching may be stopped at the time it reaches the p-type semiconductor layer 107A, and the insulating layer 115A as the first protective layer 115 may be formed. In this embodiment, the first protective layer 115 covers a range from the upper part of the i-type semiconductor layer up to a part of the sidewall of the electrode 109. However, the first protective layer 115 may cover the side surface of the metal layer 108 for silicide entirely.

Second Embodiment

Descriptions will now be made to a method for manufacturing a semiconductor memory device according to the second embodiment of the present invention. The same elements as those of the first embodiment are identified by the same reference numerals, and thus will not repeatedly be described in this embodiment.

FIGS. 19A to 19C to FIGS. 29A to 29C are diagrams showing the method for manufacturing a semiconductor memory device according to this embodiment. In the previous embodiment, the memory cells 100 having a pillar-like form are formed through the one etching process using the isolated mask pattern. In this embodiment, however, bit line patterns are formed through a different etching process as that of the etching process for forming word line patterns. In addition, the memory cells 100 and the word lines 123 are self-aligned.

Figure 19A:
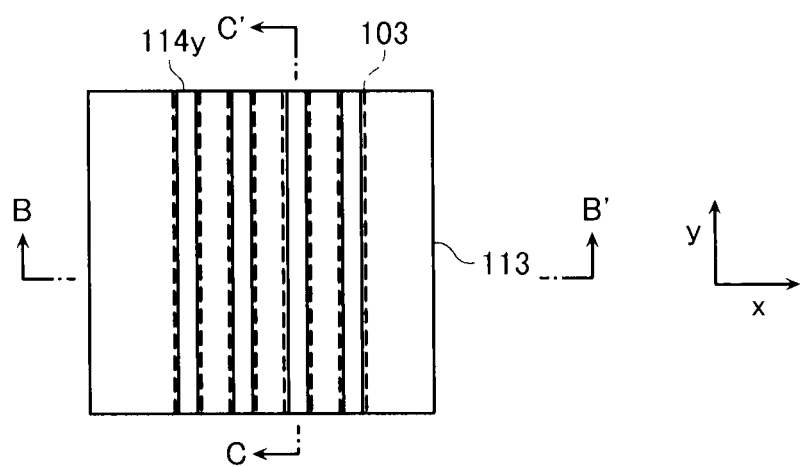
FIGS. 19A to 19C are a plane view, a front view, and a side view, for explaining a method for manufacturing a semiconductor memory device according to a second embodiment.
Figure 19B:
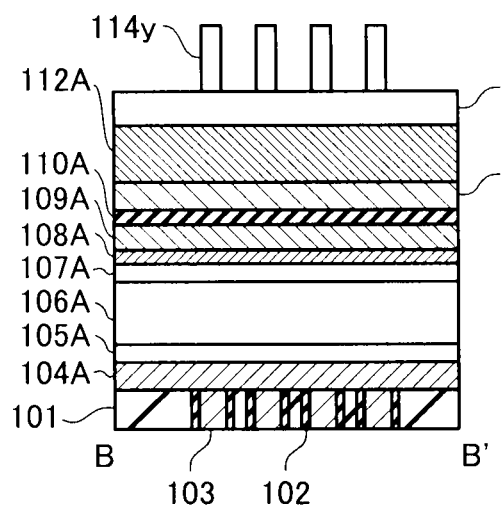
Figure 19C:
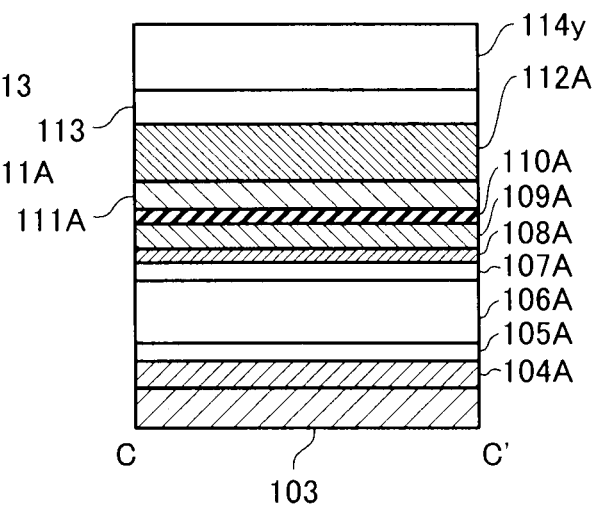

Processes of FIGS. 8A to 8C and FIGS. 9A to 9C are the same as those of the first embodiment. In this embodiment, on the structure shown in FIGS. 9A to 9C, the conductive layer 112A as the top electrode 112 and the hard mask 113 are accumulated, and a resist pattern 114y with a line and space pattern is formed thereon, as shown in FIGS. 19A to 19C. The resist pattern 114y with a line and space pattern is formed to overlap the bit lines 103 in the xy plane.

Figure 20A:
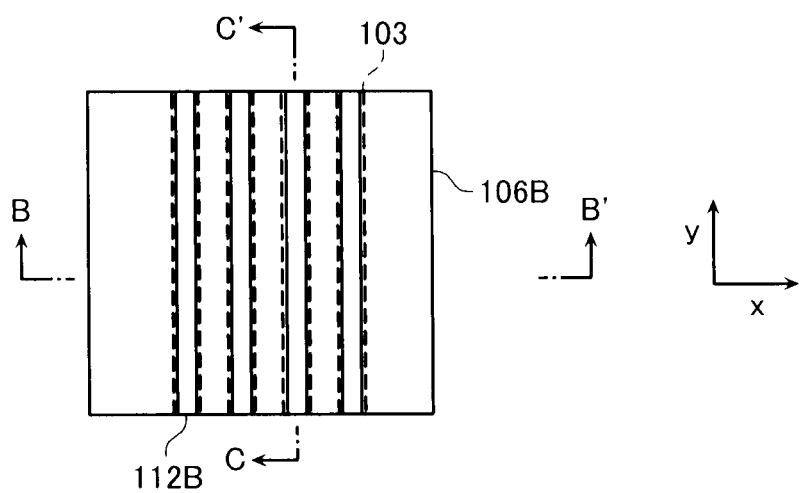
FIGS. 20A to 20C are a plane view, a front view, and a side view, for explaining the method for manufacturing the same semiconductor memory device.
Figure 20B:
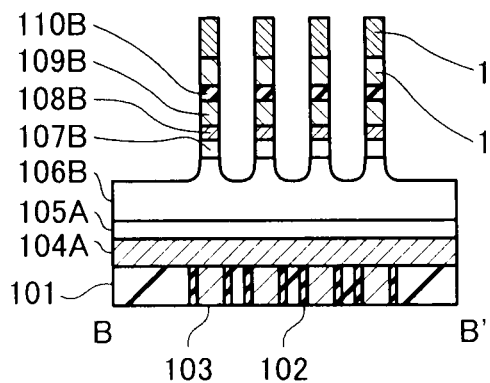
Figure 20C:
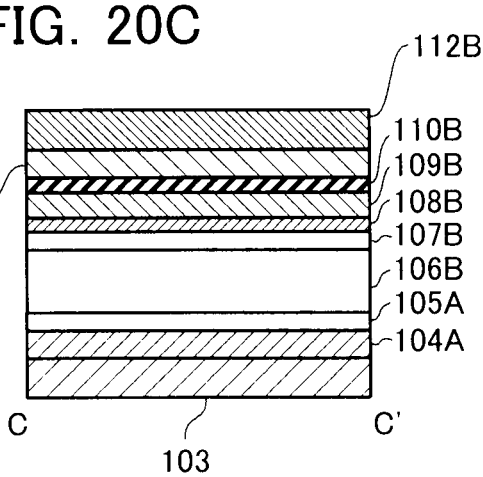
Figure 21A:
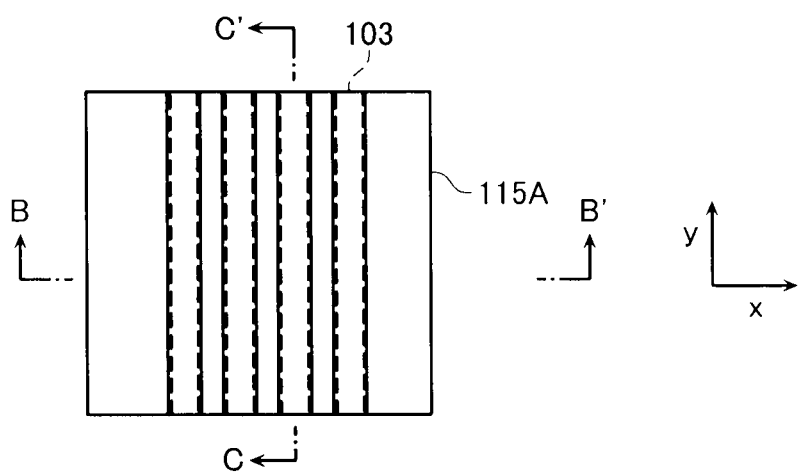
FIGS. 21A to 21C are a plane view, a front view, and a side view, for explaining the method for manufacturing the same semiconductor memory device.
Figure 21B:
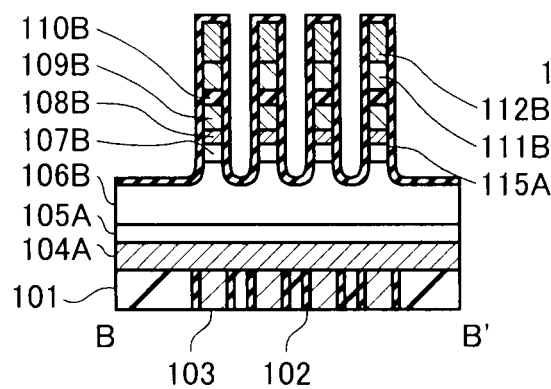
Figure 21C:
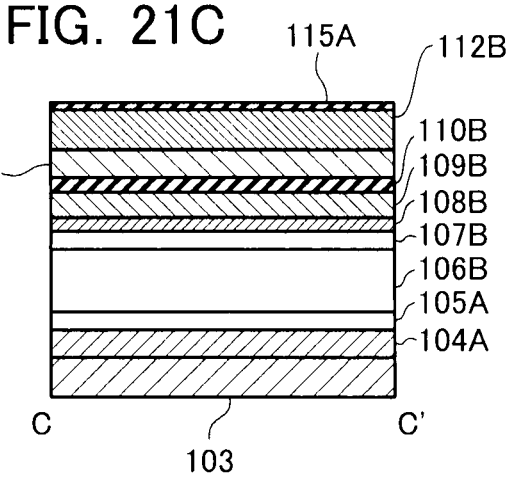
Figure 22A:
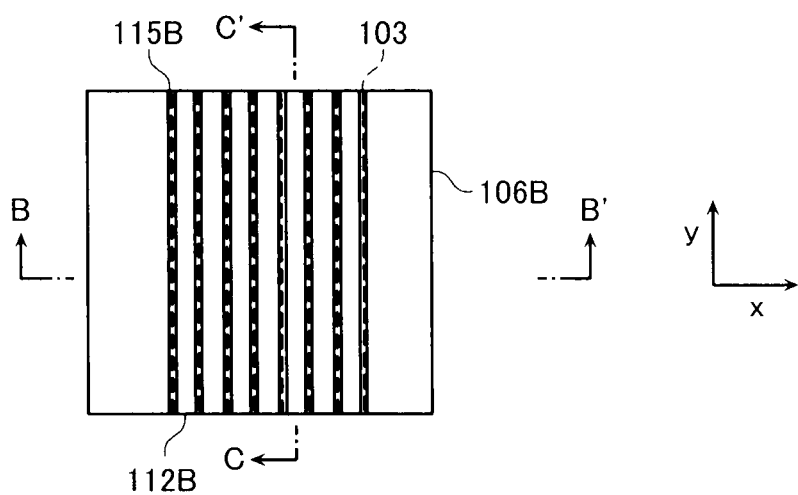
FIGS. 22A to 22C are a plane view, a front view, and a side view, for explaining the method for manufacturing the same semiconductor memory device.
Figure 22B:
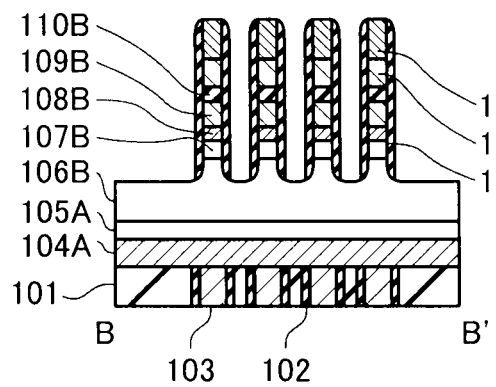
Figure 22C:
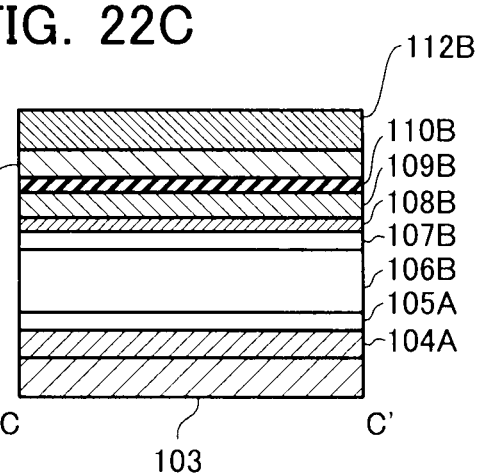
Figure 23A:
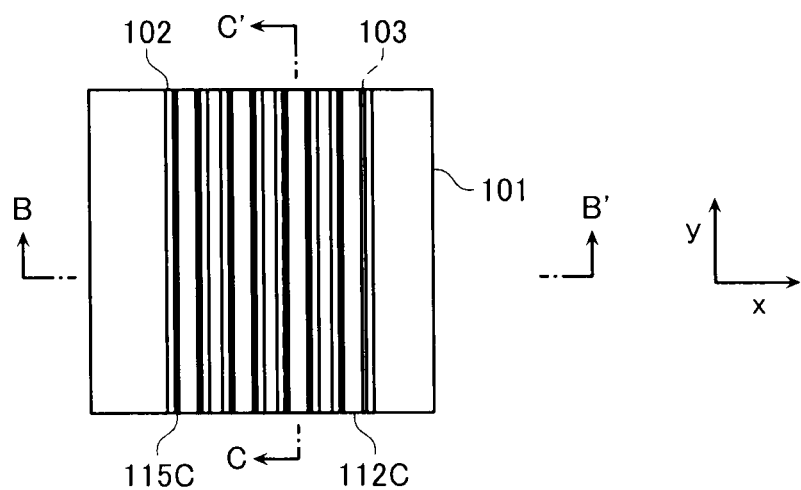
FIGS. 23A to 23C are a plane view, a front view, and a side view, for explaining the method for manufacturing the same semiconductor memory device.
Figure 23B:
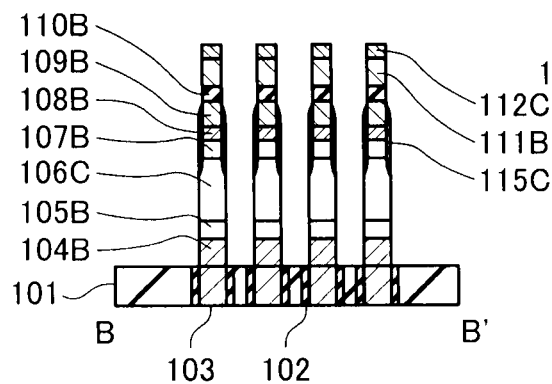
Figure 23C:
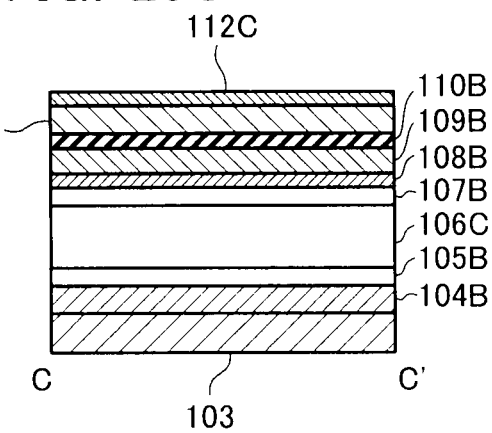
Figure 24A:
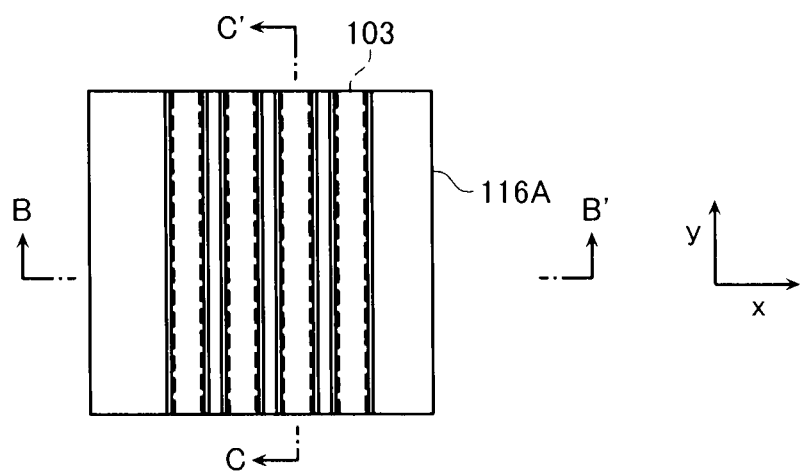
FIGS. 24A to 24C are a plane view, a front view, and a side view, for explaining the method for manufacturing the same semiconductor memory device.
Figure 24B:
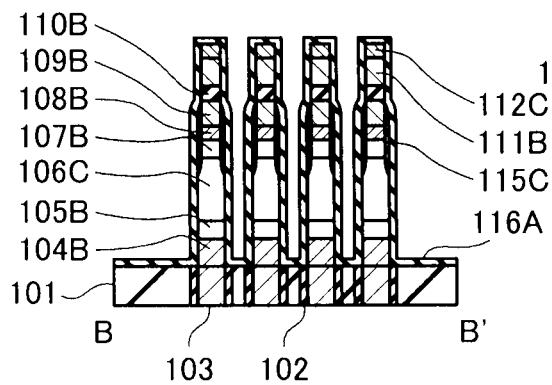
Figure 24C:
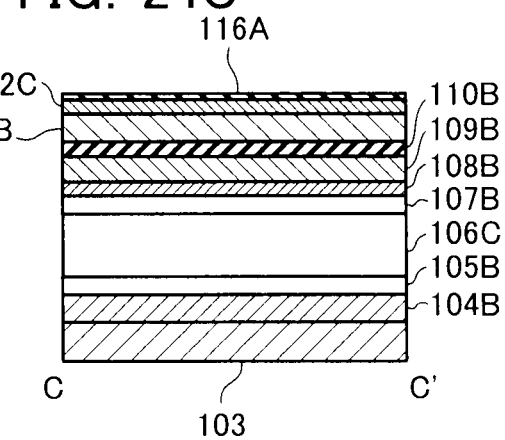
Figure 25A:
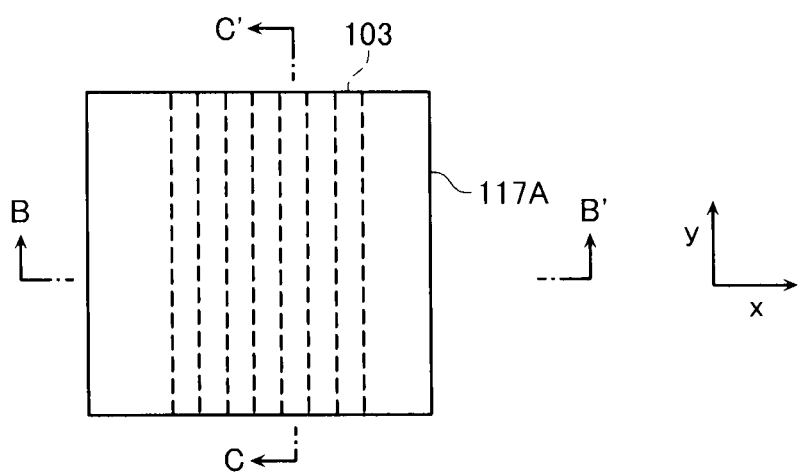
FIGS. 25A to 25C are a plane view, a front view, and a side view, for explaining the method for manufacturing the same semiconductor memory device.
Figure 25B:
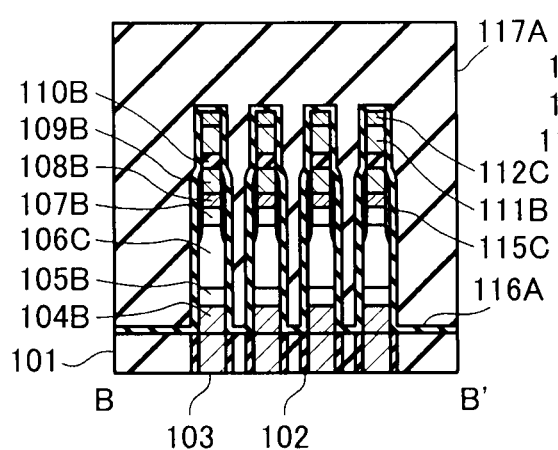
Figure 25C:
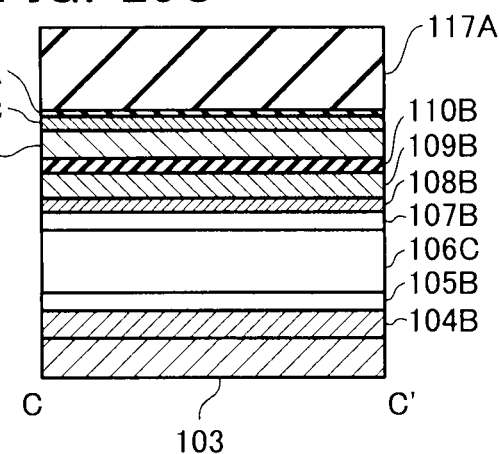

As shown in FIGS. 15A to 15C to FIGS. 17A to 17C, the etching processes and the formation of the protective layers are performed, using the resist pattern 114y with the line and space pattern. That is, as shown in FIGS. 20A to 20C, the hard mask 113 and the conductive layer 112A are etched, with using the resist pattern 114y as a mask. After that, the etching is performed in a range from the conductive layer 111A to the upper surface of the i-type semiconductor layer 106A with using the processed hard mask 113 and the conductive layer 112A as a mask, and the insulating layer 115A is formed as the first protective layer 115, as shown in FIGS. 21A to 21C. As shown in FIGS. 22A to 22C and FIGS. 23A to 23C, the etching progresses down to the bottom of the conductive layer 104A, and the insulating layer 116A is formed as the second protective layer 116, as shown in FIGS. 24A to 24C. As shown in FIGS. 25A to 25C, the interlayer insulating layer 117B is embedded thereinto, and the CMP is performed as shown in FIGS. 26A to 26C.

Figure 26A:
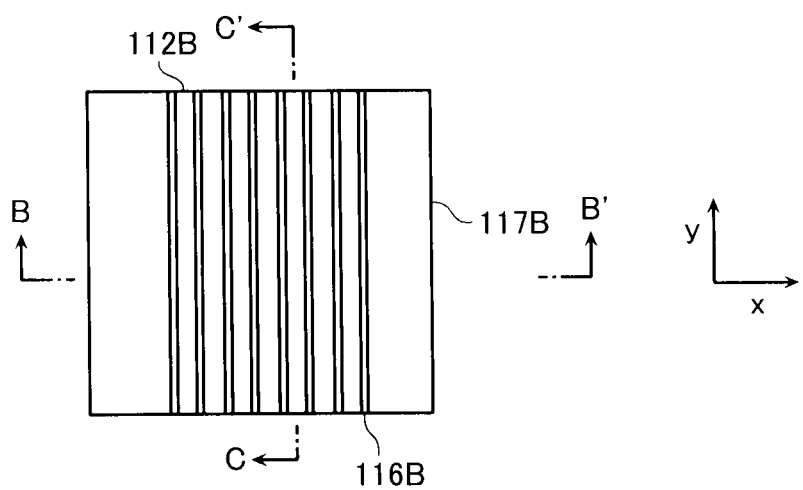
FIGS. 26A to 26C are a plane view, a front view, and a side view, for explaining the method for manufacturing the same semiconductor memory device.
Figure 26B:
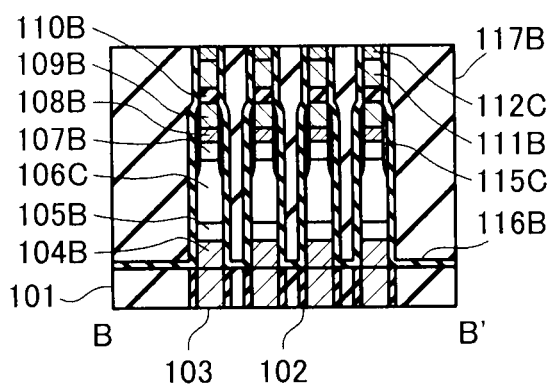
Figure 26C:
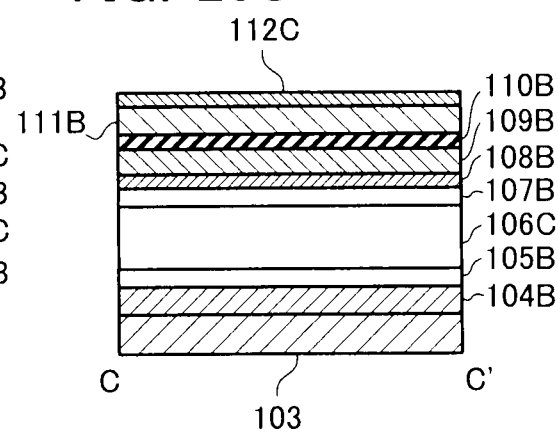
Figure 27A:
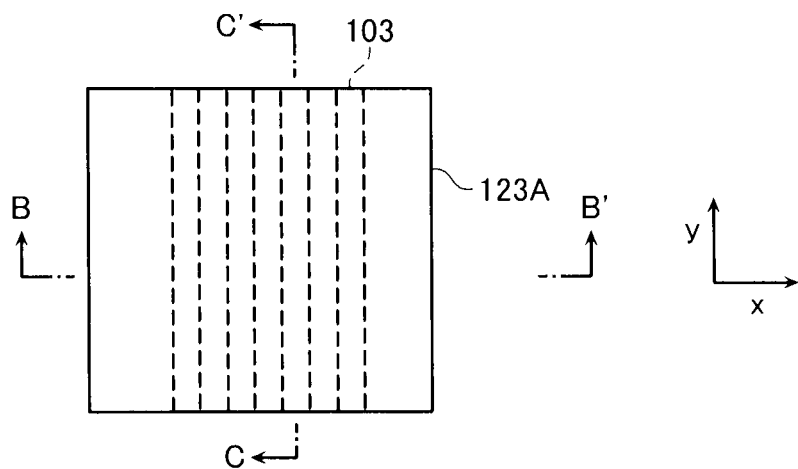
FIGS. 27A to 27C are a plane view, a front view, and a side view, for explaining the method for manufacturing the same semiconductor memory device.
Figure 27B:
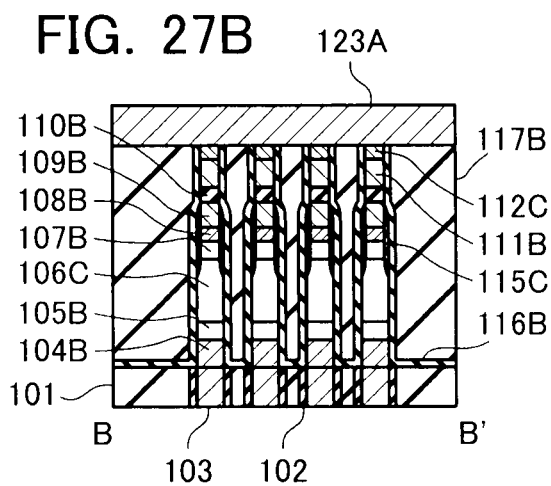
Figure 27C:
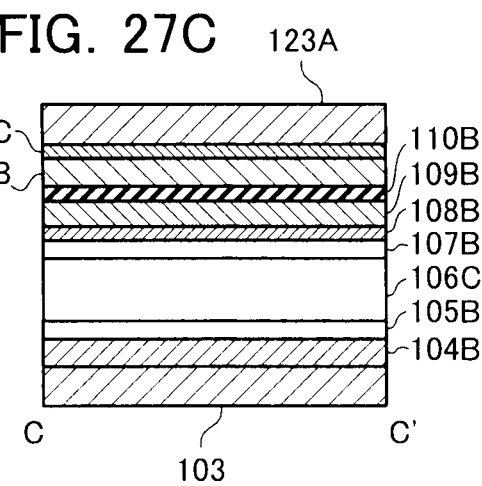
Figure 28A:
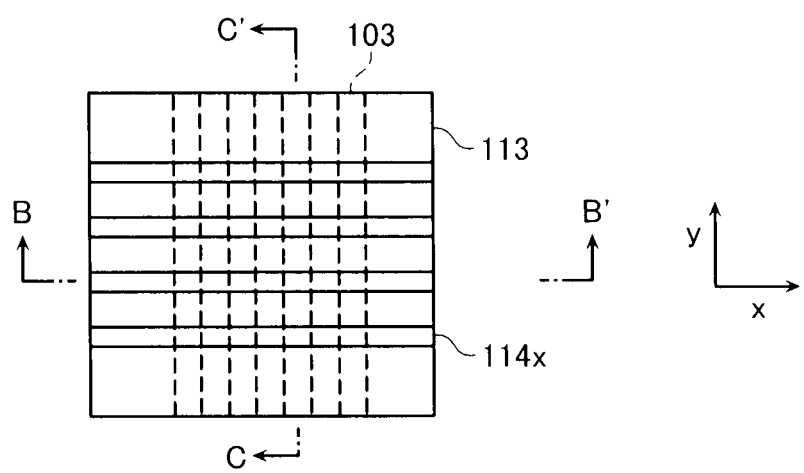
FIGS. 28A to 28C are a plane view, a front view, and a side view, for explaining the method for manufacturing the same semiconductor memory device.
Figure 28B:
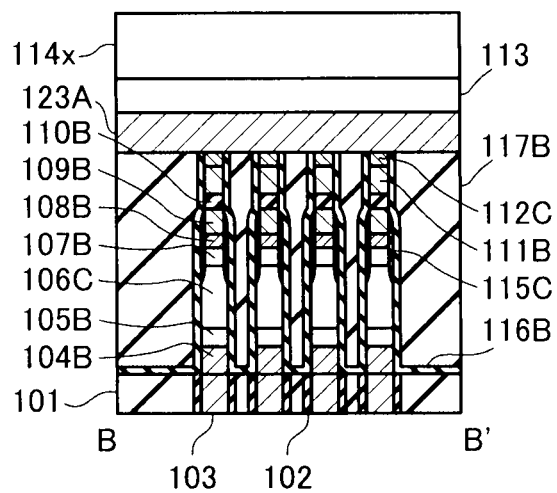
Figure 28C:
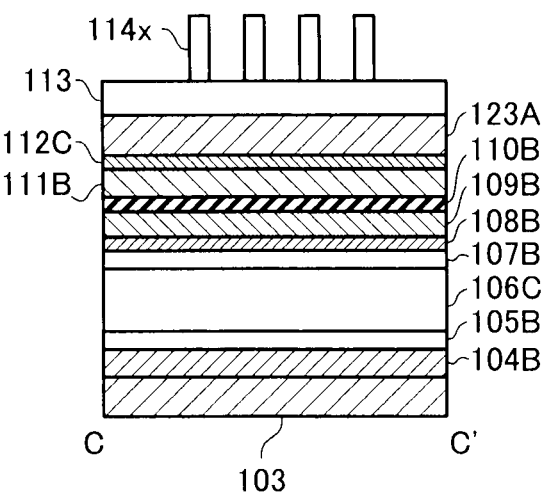
Figure 29A:
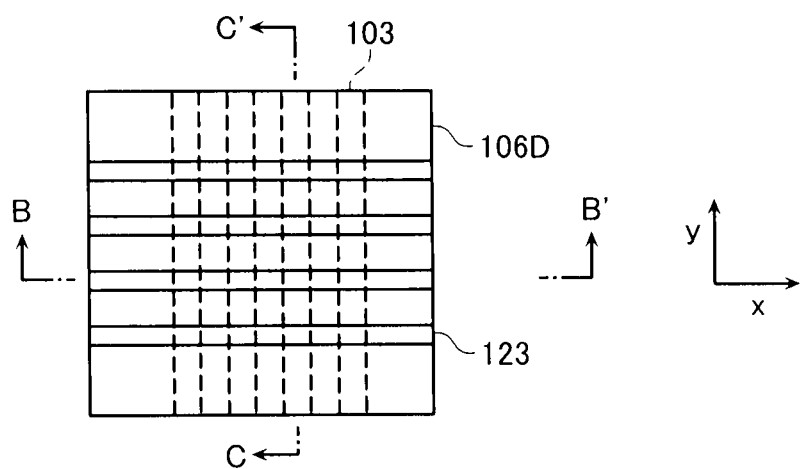
FIGS. 29A to 29C are a plane view, a front view, and a side view, for explaining the method for manufacturing the same semiconductor memory device.
Figure 29B:
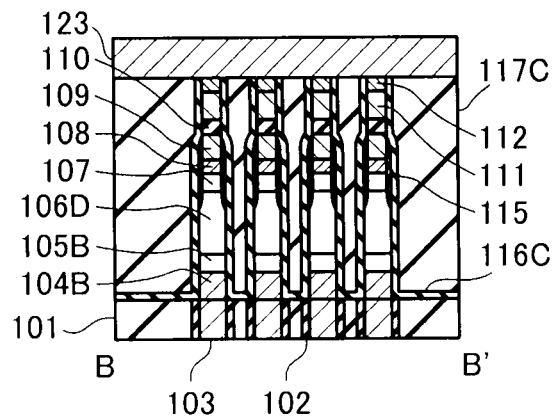
Figure 29C:
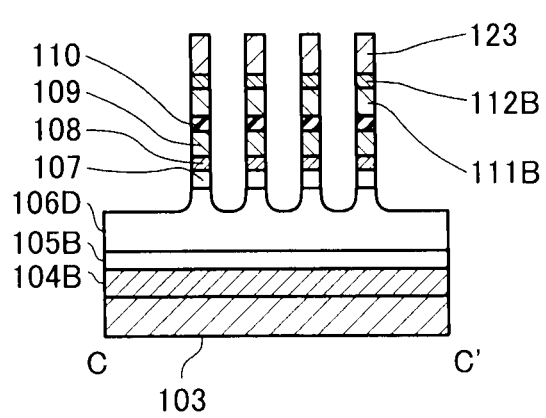
Figure 30A:
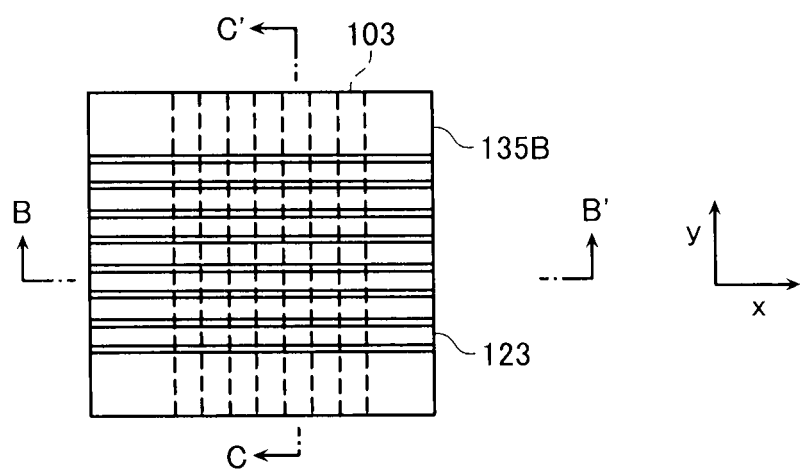
FIGS. 30A to 30C are a plane view, a front view, and a side view, for explaining the method for manufacturing the same semiconductor memory device.
Figure 30B:
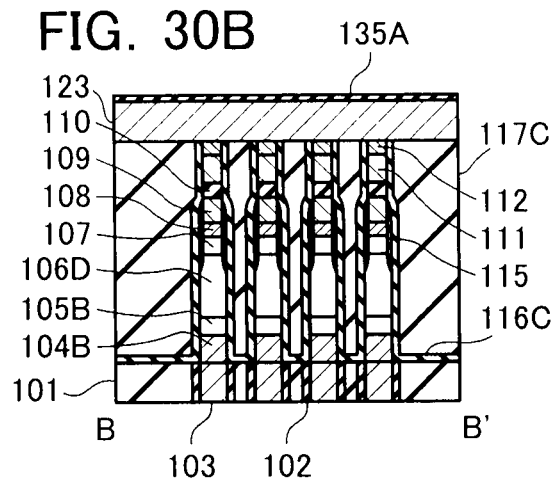
Figure 30C:
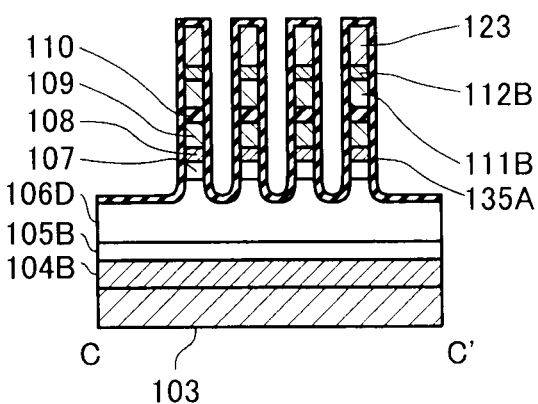
Figure 31A:
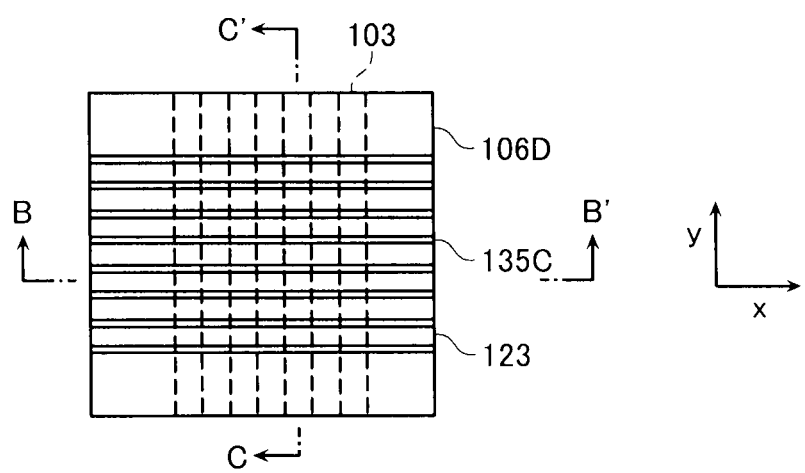
FIGS. 31A to 31C are a plane view, a front view, and a side view, for explaining the method for manufacturing the same semiconductor memory device.
Figure 31B:
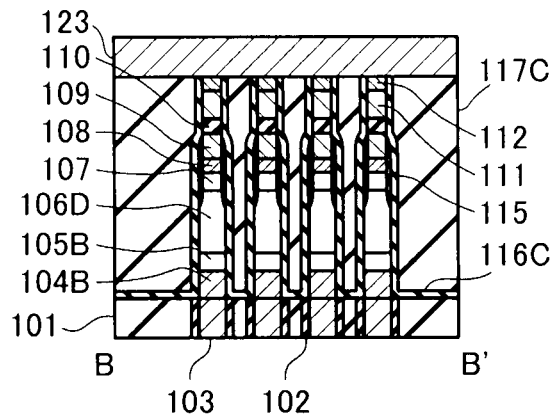
Figure 31C:
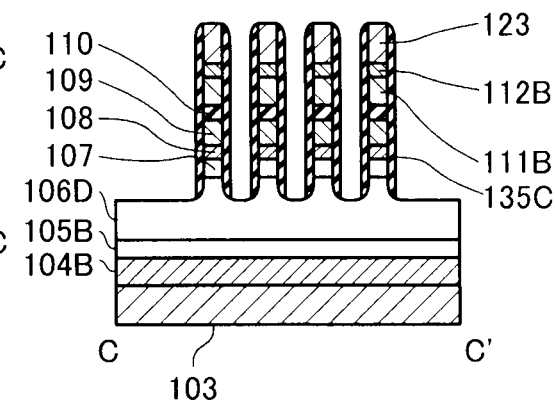
Figure 32A:
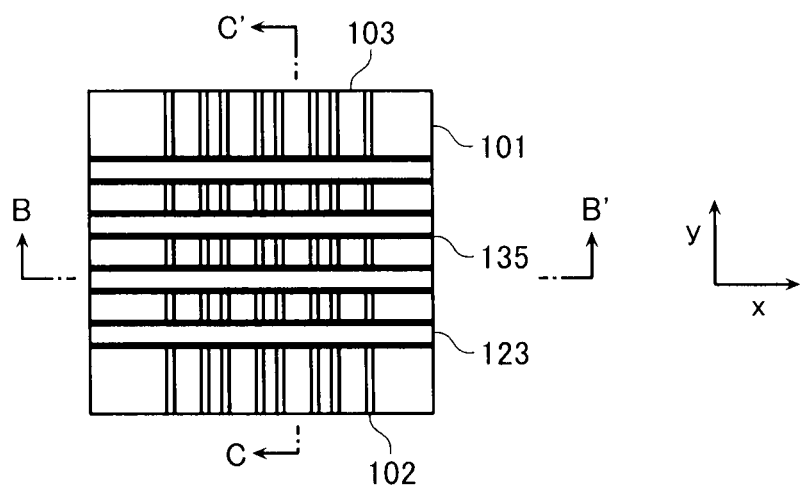
FIGS. 32A to 32C are a plane view, a front view, and a side view, for explaining the method for manufacturing the same semiconductor memory device.
Figure 32B:
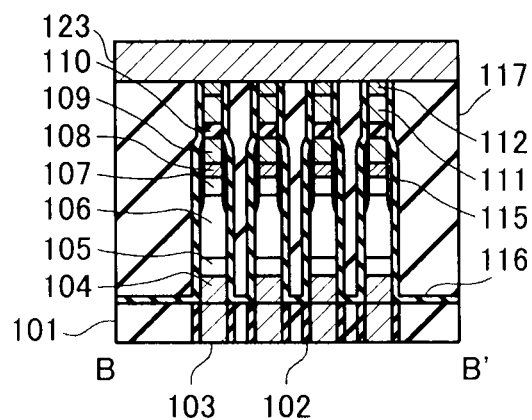
Figure 32C:
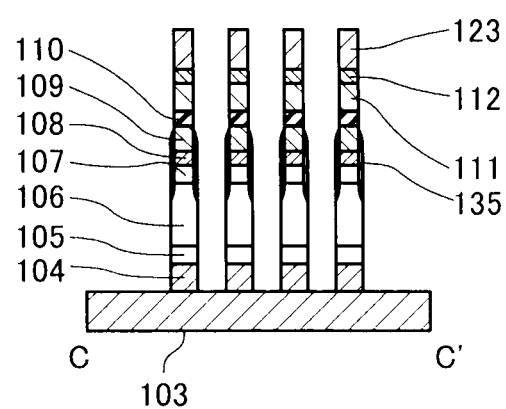
Figure 33A:
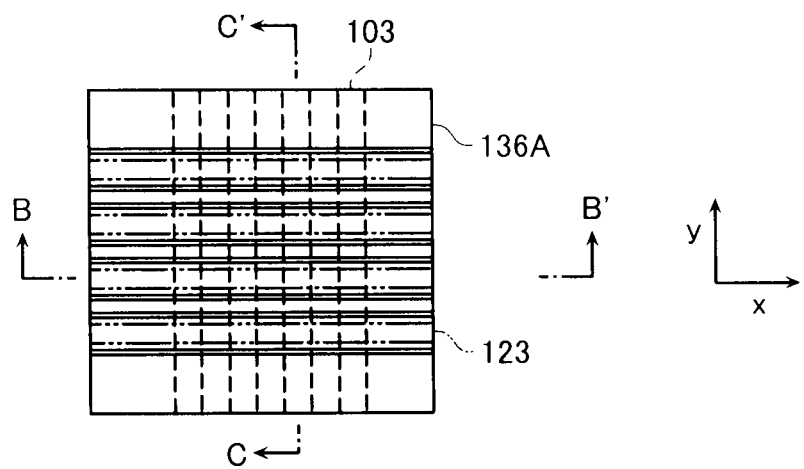
FIGS. 33A to 33C are a plane view, a front view, and a side view, for explaining the method for manufacturing the same semiconductor memory device.
Figure 33B:
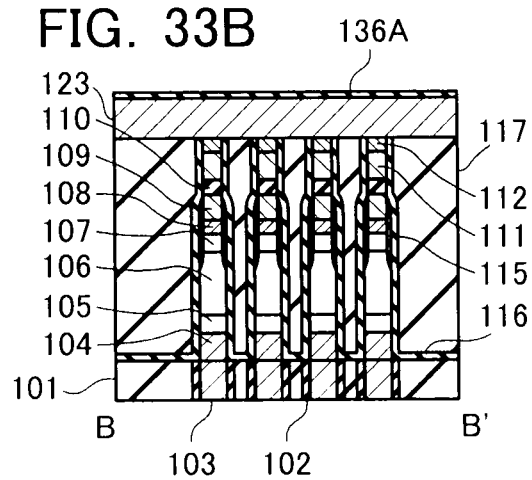
Figure 33C:
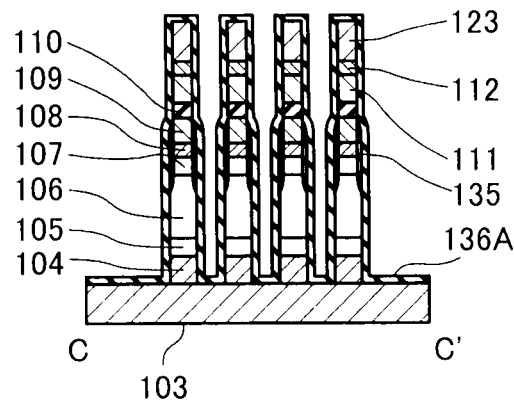
Figure 34A:
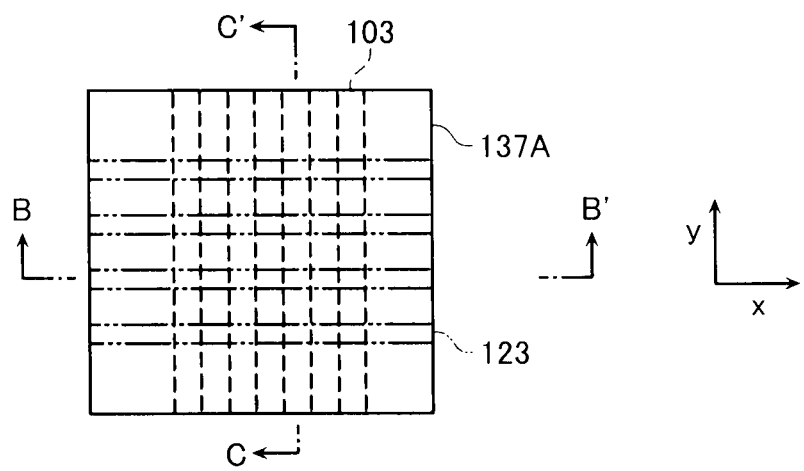
FIGS. 34A to 34C are a plane view, a front view, and a side view, for explaining the method for manufacturing the same semiconductor memory device.
Figure 34B:
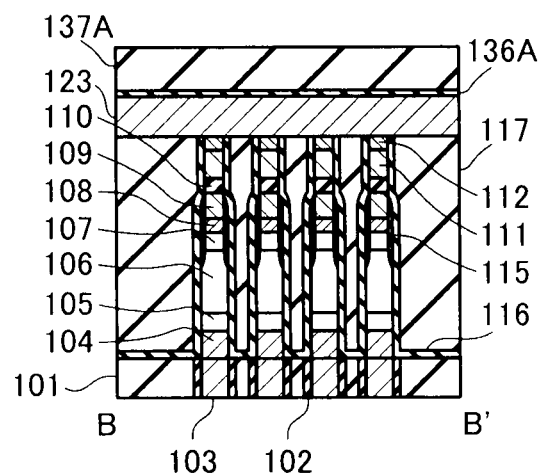
Figure 34C:
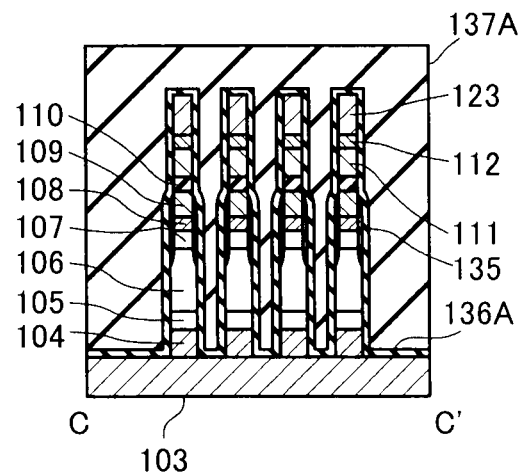

Accordingly, as shown in FIGS. 26A to 26C, laminated structure including a conductive layer 104B, an n-type semiconductor layer 105B, an i-type semiconductor layer 106C, a p-type semiconductor layer 107B, a metal layer 108B, a conductive layer 109B, a variable resistance layer 110B, a conductive layer 111B, and a conductive layer 112B is formed. The laminated structure is formed along the bit line 103. In this laminated structure, the insulating layer 115C is formed to cover a range from the upper part of the i-type semiconductor layer 106B to a part of the sidewall of the conductive layer 109B, and the insulating layer 116B is formed to cover the sidewall from the conductive layer 104B to the conductive layer 112B.

Figure 35A:
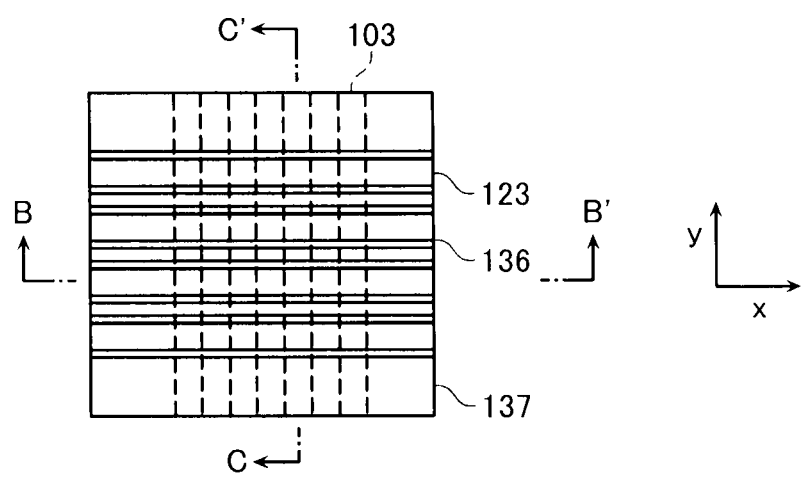
FIGS. 35A to 35C are a plane view, a front view, and a side view, for explaining the method for manufacturing the same semiconductor memory device.
Figure 35B:
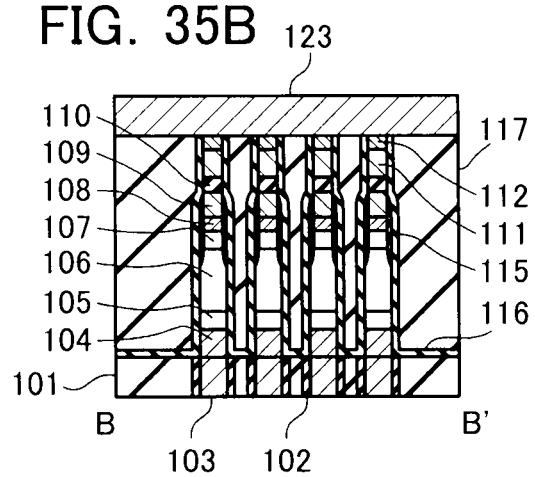
Figure 35C:
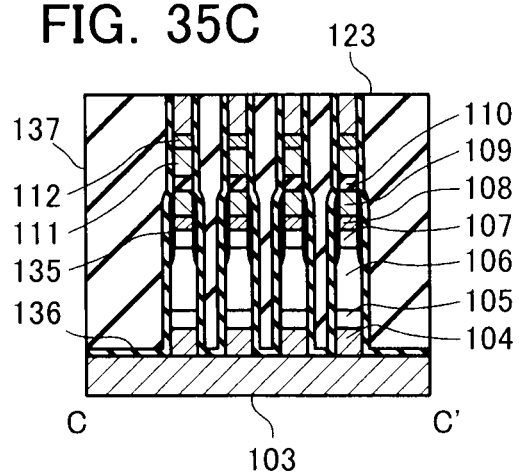

As shown in FIGS. 27A to 27C and FIGS. 28A to 28C, a conductive layer 123A and the hard mask 113 are accumulated on the upper surfaces of the interlayer insulating layer 117B, the insulating layer 116B, and the conductive layer 112C. Further, resist patterns 114x with the line and space pattern are formed on the laminated structure. At this time, the resister patterns 114x are so formed to intersect the bit lines 103 in the xy plane. As shown in FIGS. 29A to 29C to FIGS. 35A to 35C, the etching processes and the formation of a first protective layer 135, a second protective layer 136 and an interlayer insulating layer 137 are performed using the resist pattern 114x with a line and space pattern. Then, the memory cell array 1 is formed as shown in FIG. 35.

In this embodiment, the word lines 123 and the memory cells 100 are formed through the same etching process, and thus are easily aligned relative to each other.

Third Embodiment

Descriptions will now be made to a method for manufacturing a semiconductor memory device according to the third embodiment of the present invention. The same elements as those of the first embodiment are identified by the same reference numerals, and thus will not repeatedly be described in this embodiment.

Figure 36A:
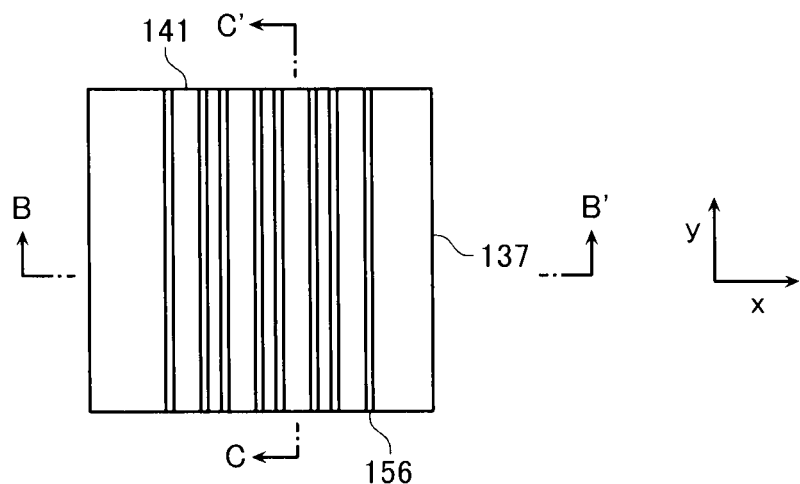
FIGS. 36A to 36C are a plane view, a front view, and a side view, for explaining a configuration of a semiconductor memory device according to a third embodiment.
Figure 36B:
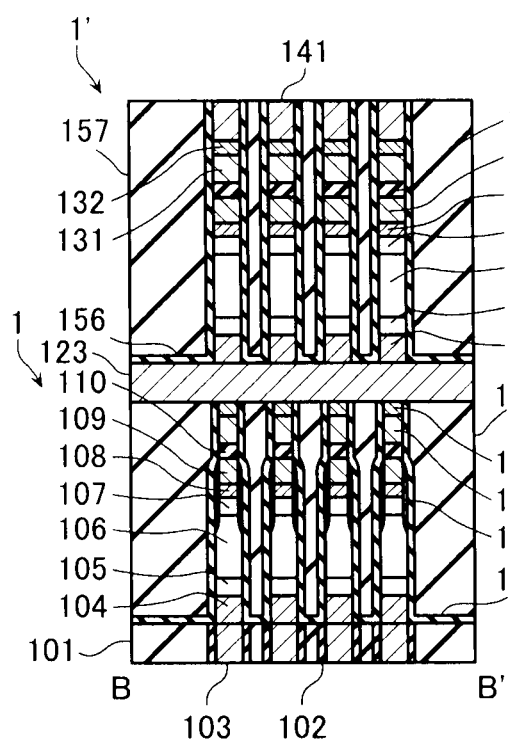
Figure 36C:
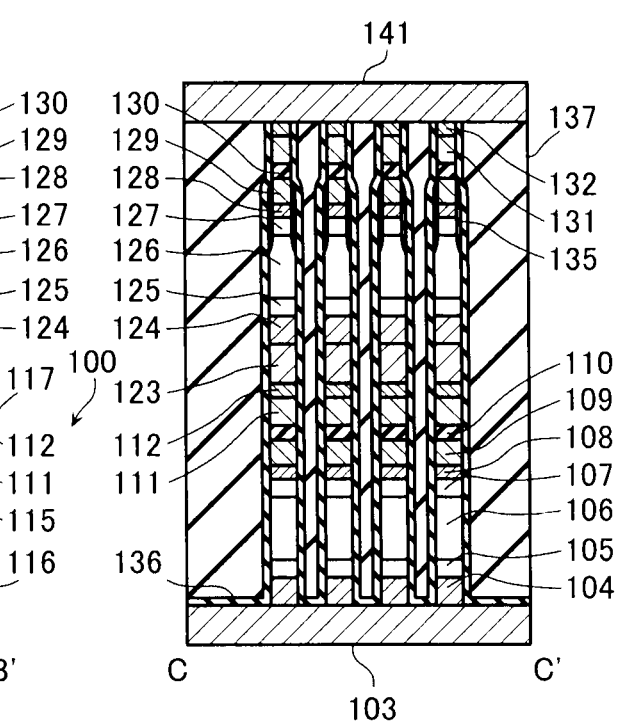

FIGS. 36A to 36C show a configuration of the semiconductor memory device of this embodiment. In the first and second embodiments, the memory cell array 1 with one layer has been described. However, the semiconductor memory device of this embodiment differs from those of the first and second embodiments, in including the memory cell arrays in a plurality of layers. That is, in the semiconductor memory device according to this embodiment, channels are formed in the direction of the bit lines in the first layer of the memory cell laminated body, channels are formed in the direction of the word lines in the second layer of the memory cell laminated body together with the first layer of the memory cell laminated body, and channels are formed in the direction of the bit lines in the third layer of the memory cell laminated body together with the second layer of the memory cell laminated body. These procedures for forming the channels are repeated to form the memory cells. As a result, the memory cell array 1 with an "n" memory cell layers can be formed only through an "n+1" etching processes.

However, in this embodiment, because the etching is performed for two layers, the metal layer for silicide on the upper layer may easily be side-etched. Thus, a first protective layer is formed on the side surface of the metal layer for silicide on the upper layer. The side surfaces protected by the first protective layer are different from each other by 90 degrees, between the even numbered layers and the odd numbered layers. That is, as shown in FIGS. 36A to 36C, the first protective layer 115 in the first layer is formed in a longitudinal direction of the bit lines 103, and the first protective layer 135 in the second layer is formed parallel to the word lines 123.

Descriptions will now be made to a method for manufacturing the semiconductor memory device according to this embodiment, with reference to FIGS. 37A to 37C to FIGS. 44A to 44C.

Figure 37A:
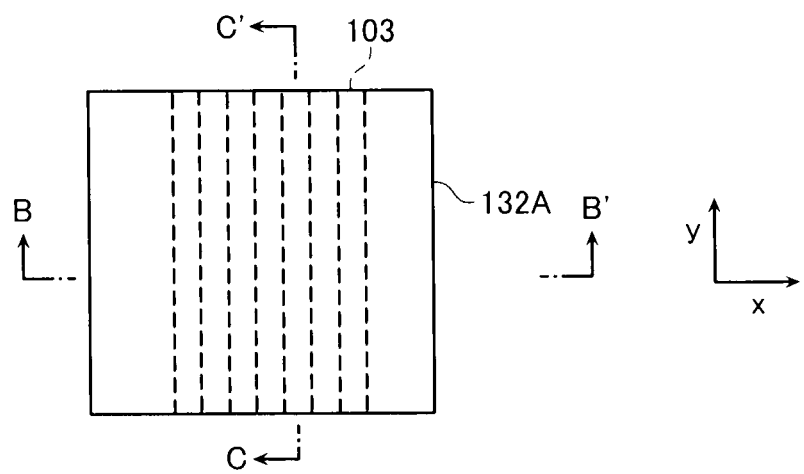
FIGS. 37A to 37C are a plane view, a front view, and a side view, for explaining a method for manufacturing the same semiconductor memory device.
Figure 37B:
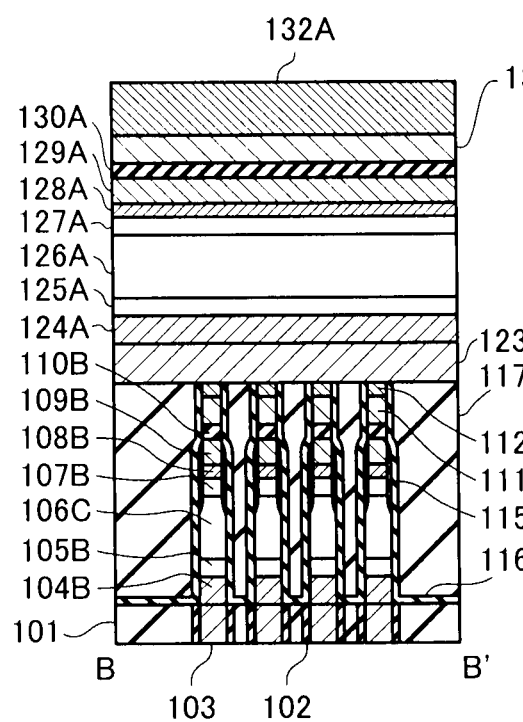
Figure 37C:
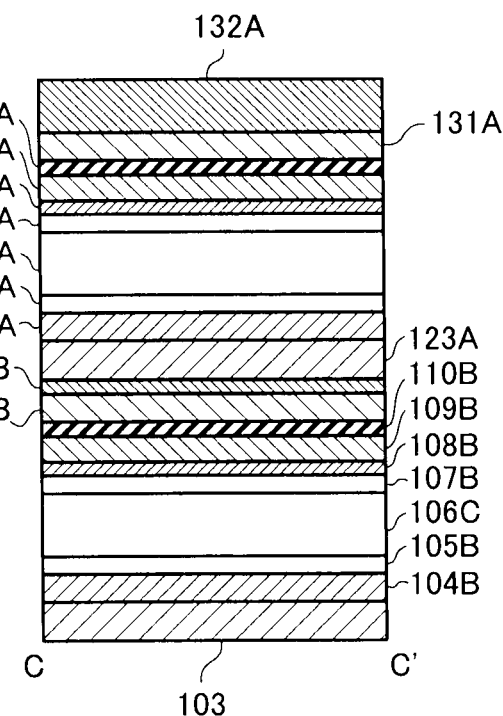
Figure 40A:
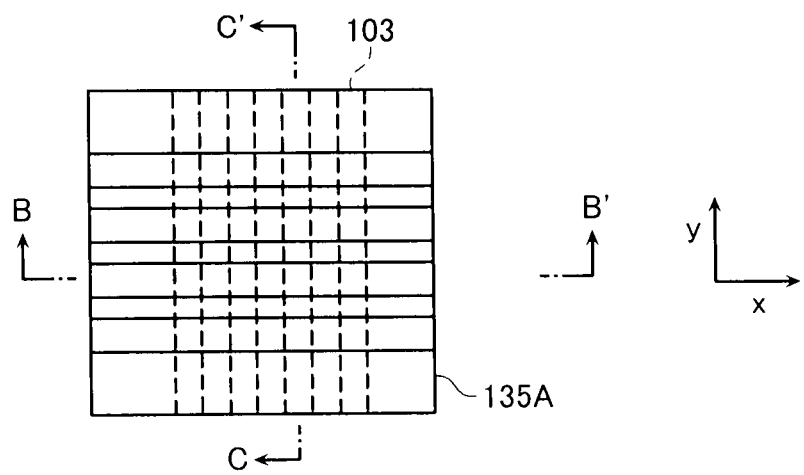
FIGS. 40A to 40C are a plane view, a front view, and a side view, for explaining a method for manufacturing the same semiconductor memory device.
Figure 40B:
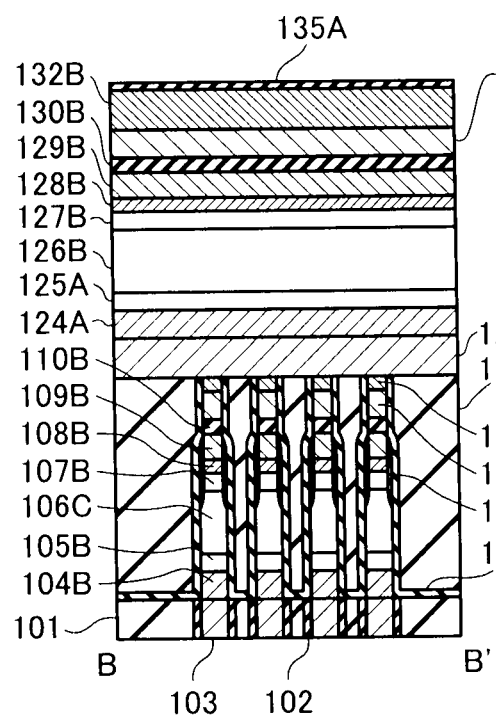
Figure 40C:
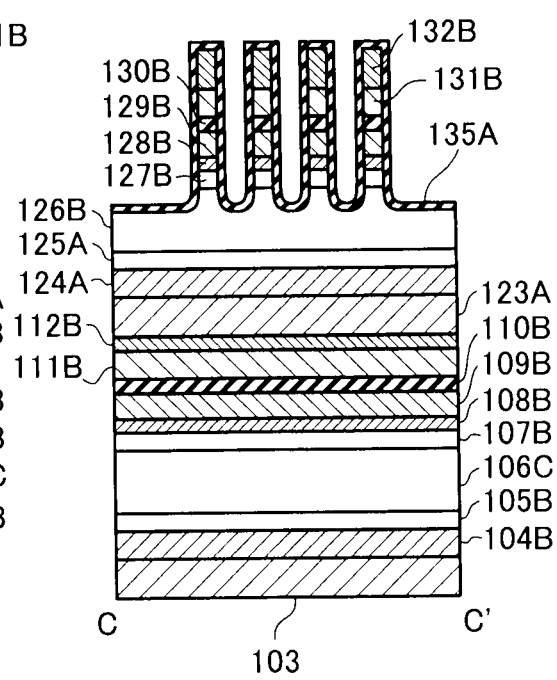
Figure 41A:
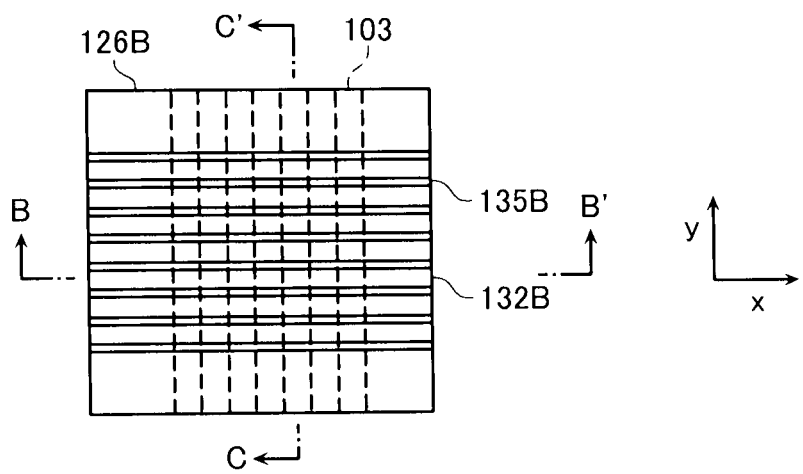
FIGS. 41A to 41C are a plane view, a front view, and a side view, for explaining a method for manufacturing the same semiconductor memory device.
Figure 41B:
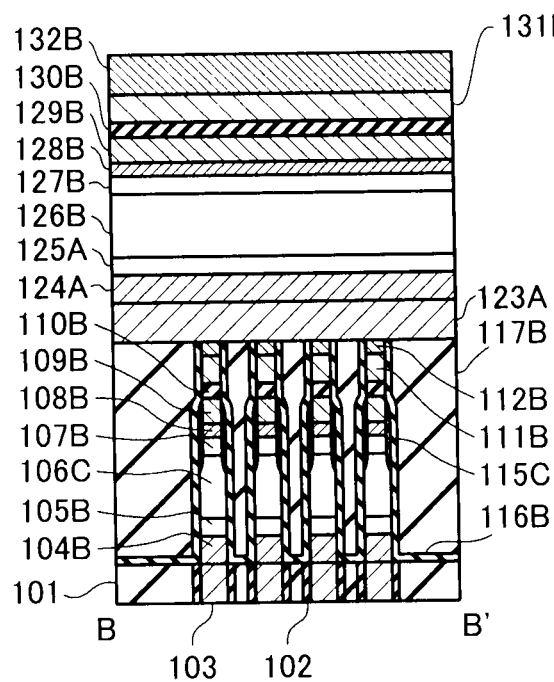
Figure 41C:
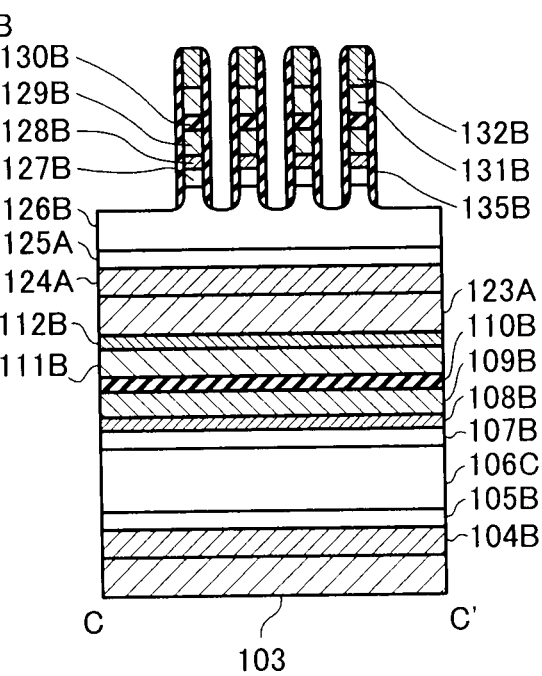

Processes shown in FIGS. 19A to 19C to FIGS. 26A to 26C are the same as those of the second embodiment. After the configuration shown in FIGS. 26A to 26C is formed, as shown in FIGS. 37A to 37C, there are formed laminated layers including the conductive layer 123A as the word line 123, a conductive layer 124A as an electrode 124, a p-type semiconductor layer 125A as a p-type semiconductor 125, an i-type semiconductor layer 126A as an i-type semiconductor layer 126, an n-type semiconductor layer 127A as an n-type semiconductor 127, a metal layer 128A as a metal layer 128 for silicide, a conductor layer 129A as an electrode 129, a variable resistance layer 130A as a variable resistance device 130, a conductive layer 131A as an electrode 131, and a conductive layer 132A as a top electrode 132.

As shown in FIGS. 38A to 38C, a hard mask 133 is accumulated on the conductive layer 132A, and a resist pattern 134 with a line and space pattern is formed. The resist pattern 134 with a line and space pattern is formed to be elongated in a direction orthogonal to the bit lines 103 in the xy plane.

As shown in FIGS. 39A to 39C, the hard mask 133 and the conductive layer 132A are etched with using the resist pattern 134 as a mask. After that, the etching is performed in a range from the conductive layer 131A to the upper surface of an i-type semiconductor layer 126A, by using the processed hard mask 133 and the conductive layer 132A as a mask. As a result, laminated bodies including an i-type semiconductor layer 126B, an n-type semiconductor layer 127B, a metal layer 128B, a conductive layer 129B, a variable resistance layer 130B, a conductive layer 131B, and a conductive layer 132B are formed.

Figure 42A:
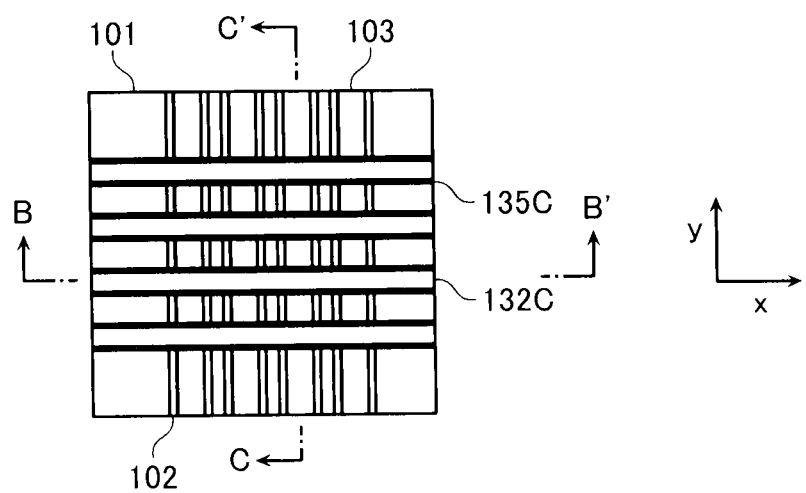
FIGS. 42A to 42C are a plane view, a front view, and a side view, for explaining a method for manufacturing the same semiconductor memory device.
Figure 42B:
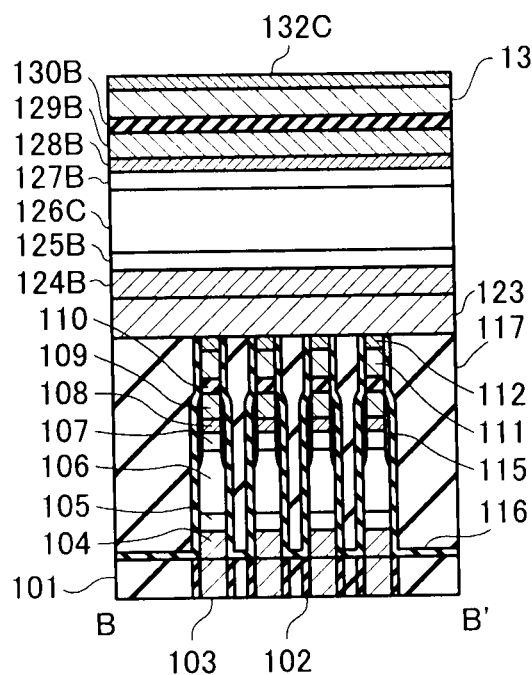
Figure 42C:
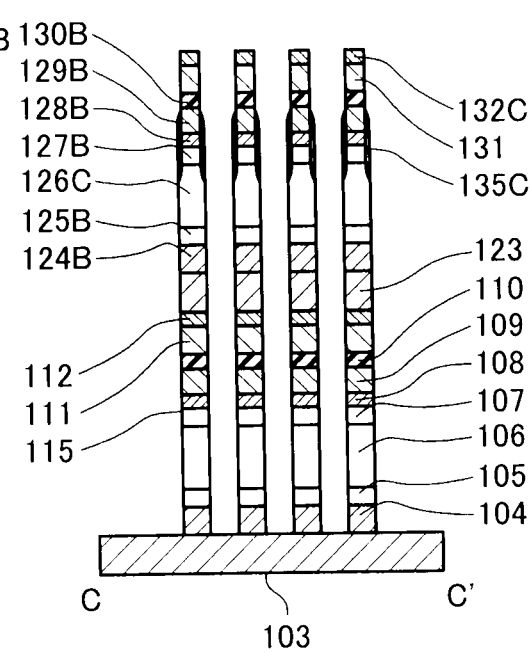
Figure 44A:
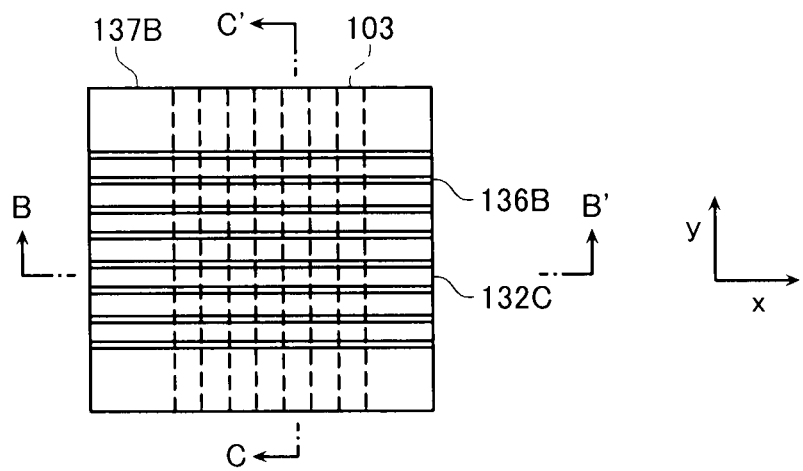
FIGS. 44A to 44C are a plane view, a front view, and a side view, for explaining a method for manufacturing the same semiconductor memory device.
Figure 44B:
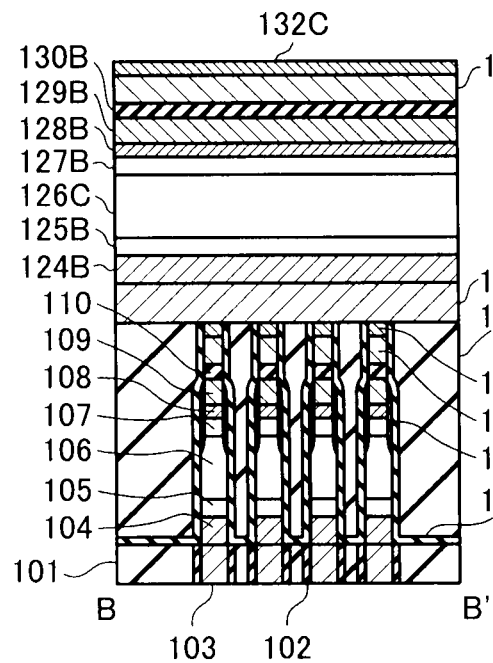
Figure 44C:
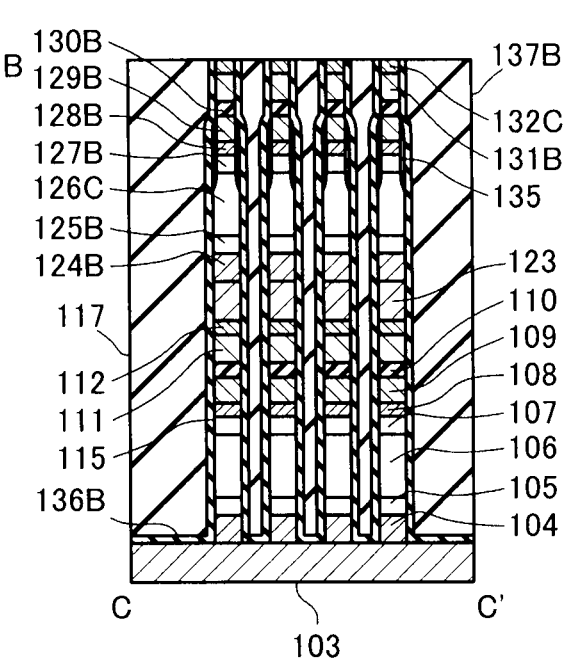

As shown in FIGS. 40A to 40C and FIGS. 41A to 41C, an insulating layer 135B as the first protective layer 135 is formed on the sidewall of the laminated body, through the same processes as those shown in FIGS. 12 and 13. After that, as shown in FIGS. 42A to 42C, the etching is performed for the structure corresponding to two layers of the memory cell arrays. At this time, there is no need to completely separate the conductive layer 104B. As shown in FIGS. 43A to 43C, an insulating layer 136A as the second protective layer 136 is formed on the side surface of the laminated body formed by etching corresponding to two layers of the memory cell arrays. As shown in FIGS. 44A to 44C, an interlayer insulating layer 137B and an insulating layer 136B are formed using an embedding technique and CMP technique. Accordingly, as shown in FIGS. 44A to 44C, the memory cells and the word lines 123 are formed in the lower layer, while the configuration shown in FIGS. 26A to 26C is formed in the upper layer.

When the memory cell array is formed further in the upper layer, the processes shown in FIGS. 37A to 37C to FIGS. 44A to 44C may be performed. When the memory cell array is no longer formed, the processes shown in FIGS. 26A to 26C to FIGS. 34A to 34C may be performed.

In the first and second embodiments, the memory cell array is formed on every layer. However, in this embodiment, the layers may be processed in the unit of two cell array layers, enabling to reduce the number of PEPs, the difficulty in processing the cell, and the difficulty in the embedding. For example, when manufacturing the memory cells including "n" cell array layers, the number of PEPs is a "2n" number of times in the second embodiment, while the number of PEPs is an "n+1" number of times in the third embodiment.

Like the method for manufacturing the semiconductor memory device according to this embodiment, in a method for manufacturing two cell array layers at once, the two cell array layers are etched at once in one etching process as shown in FIGS. 42A to 42C. In this process, the composition on the upper layer is exposed to the etching gas relatively for a long time. Thus, if the first protective layer 135 does not exist, the metal layer 128 for silicide is exposed to the etching gas for a long time.

In this embodiment, the sidewall of the metal layer 128 for silicide is covered with the first protective layer 135, thereby avoiding this problem, and enabling to stably manufacture the semiconductor memory device.

Fourth Embodiment

Figure 45:
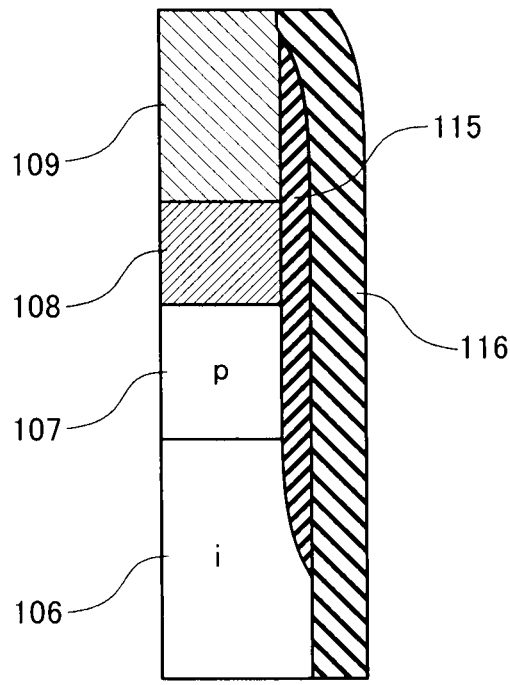
FIG. 45 is an enlarged sectional view of a partial configuration of a semiconductor memory device according to a fourth embodiment.

Descriptions will now be made to a semiconductor memory device according to a fourth embodiment of the present invention. The entire configuration of this embodiment is the same as that of the third embodiment. FIG. 45 shows an enlarged view of a part of a non-volatile semiconductor memory device according to the fourth embodiment.

The first protective layer 115 covers a range from the side surface of the metal layer 108 for silicide, the p-type semiconductor layer 107 of the diode, and a slightly lower part of the interface of the i-type semiconductor layer 106 and p-type semiconductor layer 107. In this embodiment, the first protective layer 115 is formed of, for example, a SiO$_2$/SiN layer, or a TEOS layer, other than SiN, while the second protective layer 116 is formed of a SiN layer.

That is, if electrons are trapped in the side surface near the interface of the i-type semiconductor layer and the p-type semiconductor layer, a large leakage current flows through the side surface, when the applied voltage is switched from the forward voltage to the reverse voltage. In this embodiment, electron traps are restrained, and the leakage current is restrained when the reverse voltage is applied, by providing a SiO$_2$/SiN film or a TEOS film on the side surface near the interface of the i-type semiconductor layer and the p-type semiconductor layer. The SiO$_2$/SiN film and the TEOS film unlikely cause electron traps to be generated, as compared with SiN.

Further, the above-described method is applicable for a multi-layer structure, by controlling the impurity concentration profiles.

Figure 46:
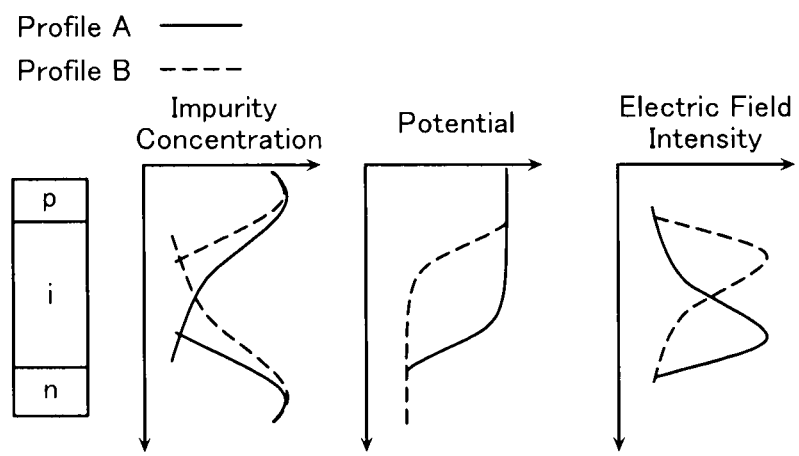
FIG. 46 is a graph showing a distribution of impurity concentration and current, in two types of PIN diodes of semiconductor memory devices.

FIG. 46 is a graph showing a distribution of two kinds of impurity concentration profiles A and B, their electric potential, and electric intensity, in two types of PIN diodes. In the graph of FIG. 46, the profile "A" is shown by a solid line, while the profile "B" is shown by a dotted line. In the profile "A", the diffusion length of impurities injected into the p-type semiconductor layer is longer than that of the impurities injected into the n-type semiconductor layer. In the profile "B", the diffusion length of impurities injected into the n-type semiconductor layer is longer than that of the impurities injected into the p-type semiconductor layer. In each of the profiles "A" and "B", the electric field is concentrated in the diffusion layer with a shorter diffusion length.

The first layer (odd-numbered layer) employs the profile "B", wherein the electric field intensity is concentrated between the p-type semiconductor layer and the i-type semiconductor layer. The second layer (even-numbered layer) employs the profile "A", wherein the electric field intensity is concentrated between the n-type semiconductor layer and the i-type semiconductor layer. In odd-numbered layers, the side surface of the metal layer 108 for silicide, the p-type semiconductor layer 107, and the upper surface of the i-type semiconductor layer 106 are covered with the first protective layer 115. In even-numbered layers, the side surface of the metal layer 128 for silicide, the n-type semiconductor layer 127, and the upper surface of the i-type semiconductor layer 126 are covered with the first protective layer 135. This realizes efficient restraint of the leakage current.

In the inventions of this specification, the bit lines 103 and the memory cells are separately formed, but may possibly be formed at the same etching process. In this case, the bit lines 103 and the memory cells are self-aligned, and thus are easily aligned relative to each other.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A method for manufacturing a semiconductor memory device including a cell array layer having a first wiring, a memory cell laminated on the first wiring, and a second wiring formed to intersect the first wiring on the memory cell, the memory cell including a current control device, a variable resistance device and a metal layer for silicide arranged therebetween, the method comprising:

forming a first wiring layer for forming the first wiring;
   sequentially forming a semiconductor layer for forming the current control device on the first wiring layer, the metal layer for silicide, and a variable resistance device layer for forming the variable resistance device;
   selectively removing the variable resistance device layer and the metal layer for silicide through first etching until it reaches the semiconductor layer, leaving a part for forming the memory cell;
   forming a first protective layer to cover at least a side surface of the metal layer for silicide exposed by the first etching;
   selectively removing the semiconductor layer which has not been removed by the first etching through second etching, leaving a part for forming the memory cell; and
   forming a second protective layer to cover the variable resistance device layer, the metal layer for silicide, and the semiconductor layer.

2. The method for manufacturing a semiconductor memory device, according to claim 1, wherein the first protective layer is formed to cover the side surface of the metal layer for silicide and a side surface near interface between the semiconductor layer and the metal layer for silicide.

3. The method for manufacturing a semiconductor memory device, according to claim 1, wherein
a plurality of the cell array layers are laminated in a direction which intersects the first wiring and the second wiring; and
a side surface of the metal layer for silicide which is covered with the first protective layer in an odd-numbered cell array layer and a side surface of the metal layer for silicide which is covered with the first protective layer in an even-numbered cell array layer are different from each other by 90 degrees.

4. The method for manufacturing a semiconductor memory device, according to claim 1, wherein
the first protective layer has a selection ratio of 10 or greater with respect to the semiconductor layer.

5. The method for manufacturing a semiconductor memory device, according to claim 4, wherein
the first protective layer is made of a SiN layer, a $SiO_2$/SiN layer or a TEOS layer.

6. The method for manufacturing a semiconductor memory device, according to claim 1, wherein
the first protective layer has a lower electron trap density than that of the second protective layer.

7. The method for manufacturing a semiconductor memory device, according to claim 6, wherein
the semiconductor layer includes a first conductive type semiconductor layer, an i type semiconductor layer and a second conductive type semiconductor layer disposed in order from a side closed to the metal layer for silicide, a diffusion length of impurities of the first conductive type semiconductor layer is shorter than a diffusion length of impurities of the second conductive type semiconductor layer.

8. A method for manufacturing a semiconductor memory device including:
a first cell array layer having first wiring, a first memory cell laminated on the first wiring, and a second wiring formed to intersect the first wiring on the first memory cell; and
a second cell array layer having the second wiring, a second memory cell laminated on the second wiring, and a third wiring formed to intersect the second wiring on the second memory cell,
the first memory cell including a first current control device, a first variable resistance device and a first metal layer for silicide arranged therebetween,
the second memory cell including a second current control device, a second variable resistance device and a second metal layer for silicide arranged therebetween, the method comprising:
sequentially forming a first wiring layer for forming the first wiring, a first semiconductor layer for forming the first current control device on the first wiring layer, the first metal layer for silicide, and a first variable resistance device layer for forming the first variable resistance device;
selectively removing the first variable resistance device layer and the first metal layer for silicide through first etching to form a first trench which reaches the first semiconductor layer, leaving a part aligned along the first wiring;
forming a first protective layer to cover a side surface of the first metal layer for silicide exposed in the first trench;
selectively removing the first semiconductor layer leaved in the first trench through second etching, leaving a part aligned along the first wiring;
forming a second protective layer to cover the first variable resistance device layer, the first metal layer for silicide, and the first semiconductor layer;
burying a first interlayer insulating layer in the first trench;
sequentially forming on the first variable resistance devise a second wiring layer for forming the second wiring, a second semiconductor layer for forming the second current control device on the second wiring layer, the second metal layer for silicide, and a second variable resistance device layer for forming the second variable resistance device;
selectively removing the second variable resistance device layer and the second metal layer for silicide through third etching to form a second trench which reaches the second semiconductor layer, leaving a part aligned along the second wiring;
forming a third protective layer to cover a side surface of the second metal layer for silicide exposed in the second trench;
selectively removing the second semiconductor layer, the second wiring layer, the first variable resistance devise, the first metal layer for silicide and the first semiconductor layer leaved in the second trench through fourth etching, leaving a part aligned along the second wiring;
forming a fourth protective layer to cover the second variable resistance device layer, the second metal layer for silicide, the second semiconductor layer, the second wiring layer, the first variable resistance devise, the first metal layer for silicide and the first semiconductor layer;
burying a second interlayer insulating layer in the second trench; and
forming a third wiring layer for forming the third wiring on the second variable resistance devise.

9. The method for manufacturing a semiconductor memory device, according to claim 8, wherein
the first protective layer is formed to cover the side surface of the first metal layer for silicide and a side surface near interface between the first semiconductor layer and the first metal layer for silicide.

10. The method for manufacturing a semiconductor memory device, according to claim 8, wherein
the third protective layer is formed to cover the side surface of the second metal layer for silicide and a side surface near interface between the second semiconductor layer and the second metal layer for silicide.

11. The method for manufacturing a semiconductor memory device, according to claim 8, wherein
the first and third protective layers have a selection ratio of 10 or greater with respect to the first and second semiconductor layers.

12. The method for manufacturing a semiconductor memory device, according to claim 11, wherein
the first and third protective layers are made of a SiN layer, a $SiO_2$/SiN layer or a TEOS layer.

13. The method for manufacturing a semiconductor memory device, according to claim 8, wherein
the first and third protective layers have a lower electron trap density than that of the second and fourth protective layers.

14. The method for manufacturing a semiconductor memory device, according to claim 13, wherein
the first semiconductor layer includes a first conductive type first semiconductor layer, an i type first semiconductor layer and a second conductive type first semiconductor layer disposed in order from a side closed to the first metal layer for silicide, a diffusion length of impurities of the first conductive type first semiconductor layer is shorter than a diffusion length of impurities of the second conductive type first semiconductor layer, the second semiconductor layer includes a first conductive type second semiconductor layer, an i type second semiconductor layer and a second conductive type second semiconductor layer disposed in order from a side closed to the second metal layer for silicide, a diffusion length of impurities of the first conductive type second semiconductor layer is shorter than a diffusion length of impurities of the second conductive type second semiconductor layer.

15. A semiconductor memory device including a cell array layer having a first wiring, a memory cell laminated on the first wiring, and a second wiring formed to intersect the first wiring on the memory cell, wherein:
   the memory cell has a current control device, a variable resistance device and a metal layer for silicide arranged therebetween;
   a first protective layer is formed on the metal layer for silicide and on a side surface near an interface between the current control device and the metal layer for silicide;
   a second protective layer is formed to cover the variable resistance device, the metal layer for silicide, the current control device, and the first protective layer; and
   the first protective layer has a lower electron trap density than that of the second protective layer.

16. The semiconductor memory device according to claim 15, wherein:
   a plurality of the cell array layers are laminated in a direction intersecting the first wiring and the second wiring; and
   a side surface of the metal layer for silicide which is covered with the first protective layer in an odd-numbered cell array layer and a side surface of the metal layer for silicide which is covered with the first protective layer in an even-numbered cell array layer are different from each other by 90 degrees.

17. The method for manufacturing a semiconductor memory device, according to claim 15, wherein
   the first protective layer has a selection ratio of 10 or greater with respect to the semiconductor layer.

18. The method for manufacturing a semiconductor memory device, according to claim 17, wherein
   the first protective layer is made of a SiN layer, a $SiO_2$/SiN layer or a TEOS layer.

19. The method for manufacturing a semiconductor memory device, according to claim 15, wherein
   the semiconductor layer includes a first conductive type semiconductor layer, an i type semiconductor layer and a second conductive type semiconductor layer disposed in order from a side closed to the metal layer for silicide, a diffusion length of impurities of the first conductive type semiconductor layer is shorter than a diffusion length of impurities of the second conductive type semiconductor layer.

20. The method for manufacturing a semiconductor memory device, according to claim 15, wherein
   the semiconductor layer includes a first conductive type semiconductor layer, an i type semiconductor layer and a second conductive type semiconductor layer disposed in order from a side closed to the metal layer for silicide, a diffusion length of impurities of the first conductive type semiconductor layer is shorter than a diffusion length of impurities of the second conductive type semiconductor layer.

* * * * *